United States Patent
Sonoda et al.

(10) Patent No.: US 9,391,275 B2
(45) Date of Patent: Jul. 12, 2016

(54) VAPOR DEPOSITION METHOD, VAPOR DEPOSITION DEVICE AND ORGANIC EL DISPLAY DEVICE

(75) Inventors: Tohru Sonoda, Osaka (JP); Nobuhiro Hayashi, Osaka (JP); Shinichi Kawato, Osaka (JP); Satoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 266 days.

(21) Appl. No.: 13/703,873

(22) PCT Filed: Aug. 17, 2011

(86) PCT No.: PCT/JP2011/068625
§ 371 (c)(1),
(2), (4) Date: Dec. 12, 2012

(87) PCT Pub. No.: WO2012/029545
PCT Pub. Date: Mar. 8, 2012

(65) Prior Publication Data
US 2013/0089941 A1    Apr. 11, 2013

(30) Foreign Application Priority Data
Aug. 30, 2010  (JP) ................................ 2010-192510

(51) Int. Cl.
*C23C 16/00* (2006.01)
*H01L 51/00* (2006.01)
(Continued)

(52) U.S. Cl.
CPC .......... *H01L 51/0008* (2013.01); *C23C 14/042* (2013.01); *H01L 51/0011* (2013.01); *H01L 27/3211* (2013.01); *H01L 27/3244* (2013.01); *H01L 51/56* (2013.01)

(58) Field of Classification Search
CPC .............................. C23C 16/04; C23C 16/042
See application file for complete search history.

(56) References Cited

U.S. PATENT DOCUMENTS 4,430,366 A  *  2/1984  Crawford et al. ............. 427/162
5,742,129 A       4/1998  Nagayama et al.
(Continued)

FOREIGN PATENT DOCUMENTS

CN           101548410 A     9/2009
JP           3-123021 A      5/1991
(Continued)

OTHER PUBLICATIONS

International Search Report received for PCT Patent Application No. PCT/JP2011/068625, mailed on Nov. 15, 2011, 5 pages (2 pages of English Translation and 3 pages of Office Action).

*Primary Examiner* — David Turocy
(74) *Attorney, Agent, or Firm* — Morrison & Foerster LLP

(57) ABSTRACT

A vapor deposition source (60), a plurality of control plates (80) and a vapor deposition mask (70) are disposed in this order. A substrate (10) is moved relative to the vapor deposition mask in a state in which the substrate and the vapor deposition mask are spaced apart at a fixed interval. Vapor deposition particles (91) discharged from a vapor deposition source opening (61) of the vapor deposition source pass through neighboring inter-control plate spaces (81) and mask openings (71) formed in the vapor deposition mask, and then adhere to the substrate to form a coating film (90). At least a part of the coating film is formed by the vapor deposition particles that have passed through two or more different inter-control plate spaces. It is thereby possible to form a coating film in which edge blur and variations in the thickness are suppressed.

11 Claims, 22 Drawing Sheets

(51) Int. Cl.
*C23C 14/04* (2006.01)
*H01L 27/32* (2006.01)
*H01L 51/56* (2006.01)

(56) References Cited

U.S. PATENT DOCUMENTS

| | | |
|---|---|---|
| 6,294,892 B1 | 9/2001 | Utsugi et al. |
| 8,859,438 B2 * | 10/2014 | Sonoda et al. ............... 438/758 |
| 2004/0115338 A1 * | 6/2004 | Yoneda ........................... 427/66 |
| 2005/0183670 A1 * | 8/2005 | Grantham et al. ............ 118/726 |
| 2005/0263074 A1 | 12/2005 | Masuda et al. |
| 2008/0131587 A1 | 6/2008 | Boroson et al. |
| 2010/0297348 A1 | 11/2010 | Lee et al. |
| 2010/0297349 A1 | 11/2010 | Lee et al. |
| 2010/0330265 A1 * | 12/2010 | Lee et al. ........................ 427/66 |
| 2011/0053300 A1 | 3/2011 | Ryu et al. |

FOREIGN PATENT DOCUMENTS

| | | |
|---|---|---|
| JP | 8-227276 A | 9/1996 |
| JP | 2000-188179 A | 7/2000 |
| JP | 2004-103269 A | 4/2004 |
| JP | 2004-169066 A | 6/2004 |
| JP | 2004-214120 A | 7/2004 |
| JP | 2005-344146 A | 12/2005 |
| JP | 2009-170200 A | 7/2009 |
| JP | 2009-203551 A | 9/2009 |
| JP | 2010-270396 A | 12/2010 |
| JP | 2010-270397 A | 12/2010 |
| JP | 2011-47035 A | 3/2011 |

* cited by examiner

VAPOR DEPOSITION METHOD, VAPOR DEPOSITION DEVICE AND ORGANIC EL DISPLAY DEVICE

CROSS REFERENCE TO RELATED APPLICATIONS

This is a U.S. National Phase patent application of PCT/JP2011/068625, filed Aug. 17, 2011, which claims priority to Japanese Patent Application No. 2010-192510, filed Aug. 30, 2010, each of which is hereby incorporated by reference in the present disclosure in its entirety.

TECHNICAL FIELD

The present invention relates to a vapor deposition method and a vapor deposition device for forming a coating film having a predetermined pattern on a substrate. The present invention also relates to an organic EL (Electro Luminescence) display device including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a thin film is formed. Vapor deposition is performed for each color of the light emitting layer, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

CITATION LIST

Patent Document

Patent Document 1: JP H8-227276A
Patent Document 2: JP 2000-188179A
Patent Document 3: JP 2004-169066A
Patent Document 4: JP 2004-103269A

DISCLOSURE OF INVENTION

Problem to be Solved by the Invention

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. In addition, the size of the gap varies depending on the position of the deposition surface of the substrate. For this reason, it is difficult to perform highly accurate patterning, and it is therefore difficult to achieve high definition due to the occurrence of positional offset of vapor deposition and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color are difficult to adapt to large-sized substrates, and no methods have been devised that can perform vapor deposition by color on large-sized substrates such as those having a size exceeding 60 inches on a mass manufacturing level.

On the other hand, the vapor deposition method is required to suppress edge blur formed by the vapor deposition material extending beyond the edge of the formed coating film. Also, the vapor deposition method is required to provide a coating film having a uniform thickness.

In an organic EL display device, if blur occurs at the edge of a light emitting layer formed by vapor deposition by color, the vapor deposition material adheres to the neighboring light emitting layer having a different color, causing color mixing. In order to prevent color mixing from occurring, it is necessary to increase the non-light-emitting region by reducing the opening width of pixels or increasing the pixel pitch. However, reduction of the opening width of pixels reduces brightness. If the current density is increased in order to obtain the required brightness, the service life of the organic EL element may be shortened, or the organic EL element may be easily damaged, reducing reliability. On the other hand, if the pixel pitch is increased, display of high definition images cannot be achieved, and the display quality decreases.

Also, in an organic EL display device, if a light emitting layer formed by vapor deposition by color has a nonuniform thickness, nonuniform light emission occurs, reducing the display quality.

It is an object of the present invention to provide a vapor deposition method and a vapor deposition device that can form a coating film in which edge blur and variations in the thickness are suppressed and that can be applied to large-sized substrates.

It is another object of the present invention to provide an organic EL display device that is excellent in terms of reliability and display quality.

Means for Solving Problem

A vapor deposition method according to the present invention is a method for producing an organic EL display device including a coating film having a predetermined pattern on a substrate, the method including a vapor deposition step of forming the coating film by causing vapor deposition particles to adhere to the substrate. The vapor deposition step is a step in which with the use of a vapor deposition unit including a vapor deposition source having a vapor deposition source opening that discharges the vapor deposition particles, a vapor deposition mask disposed between the vapor deposition source opening and the substrate, and a plurality of control plates disposed between the vapor deposition source opening and the vapor deposition mask in a first direction that is orthogonal to a normal line direction of the substrate, in a state in which the substrate and the vapor deposition mask are spaced apart at a fixed interval, the vapor deposition particles that have passed through neighboring inter-control plate spaces in the first direction and a plurality of mask openings formed in the vapor deposition mask are caused to adhere to the substrate while one of the substrate and the vapor deposition unit is moved relative to the other in a second direction that is orthogonal to the normal line direction of the substrate and the first direction. At least a part of the coating film is formed by the vapor deposition particles that have passed through two or more different inter-control plate spaces.

A vapor deposition device according to the present invention is a vapor deposition device that forms a coating film having a predetermined pattern on a substrate, the device including: a vapor deposition unit including a vapor deposition source having a vapor deposition source opening that discharges vapor deposition particles for forming the coating film, a vapor deposition mask disposed between the vapor deposition source opening and the substrate and a plurality of control plates disposed between the vapor deposition source opening and the vapor deposition mask in a first direction that is orthogonal to a normal line direction of the substrate; and a moving mechanism that, in a state in which the substrate and the vapor deposition mask are spaced apart at a fixed interval, moves one of the substrate and the vapor deposition unit relative to the other in a second direction that is orthogonal to the normal line direction of the substrate and the first direction. At least a part of the coating film is formed by the vapor deposition particles that have passed through two or more different inter-control plate spaces.

A method for manufacturing an organic EL display device according to the present invention includes a step of forming a light emitting layer using the vapor deposition method described above.

An organic EL display device according to the present invention includes a light emitting layer formed by using the above vapor deposition method.

Effects of the Invention

According to the vapor deposition method and vapor deposition device of the present invention, the vapor deposition particles that have passed through the mask openings formed in the vapor deposition mask are caused to adhere to the substrate while one of the substrate and the vapor deposition unit is moved relative to the other. Therefore, a vapor deposition mask that is smaller than the substrate can be used. It is therefore possible to form a coating film even on a large-sized substrate by vapor deposition.

Also, the plurality of control plates provided between the vapor deposition source and the vapor deposition mask selectively capture the vapor deposition particles that have entered the inter-control plate spaces according to the incidence angle of the vapor deposition particles, and thus only the vapor deposition particles entering at a predetermined incidence angle or less enter the mask openings. As a result, the maximum incidence angle of the vapor deposition particles with respect to the substrate becomes small, and it is therefore possible to suppress blur that occurs at the edge of the coating film formed on the substrate.

Furthermore, at least a part of the coating film is formed by the vapor deposition particles that have passed through two or more different inter-control plate spaces. The uniformity of the thickness of the coating film is thereby improved.

The organic EL display device of the present invention includes a light emitting layer formed by using the vapor deposition method described above, and therefore edge blur in the light emitting layer and variations in the thickness of the light emitting layer are suppressed. Accordingly, it is possible to provide a high-quality and highly reliable organic EL display device that can be made in a large size.

DESCRIPTION OF THE INVENTION

Figure 1:
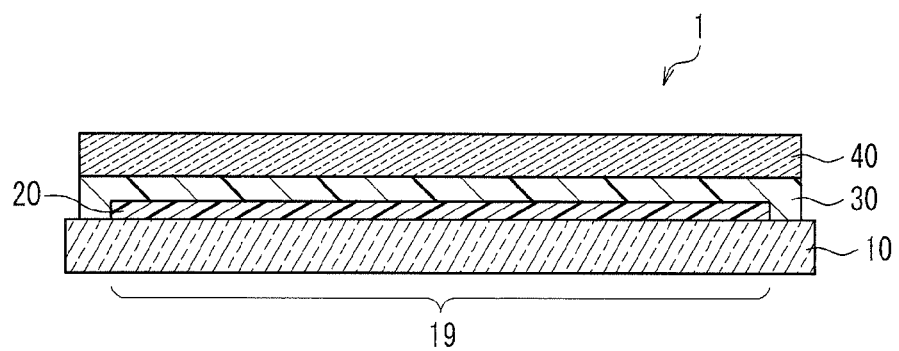
FIG. 1 is a cross-sectional view showing a schematic configuration of an organic EL display device.

In the vapor deposition method of the present invention described above, it is preferable that a major surface of each of the plurality of control plates is parallel to the second direction.

With this preferred configuration, the inter-control plate space is substantially open in the second direction, and thus the control plates do not substantially have a function of limiting the spread angle of the vapor deposition particles in the second direction. Accordingly, the reduction of the material utilization efficiency due to provision of a plurality of control plates can be small.

It is preferable that a plurality of the vapor deposition source openings are arranged in the first direction, and the plurality of vapor deposition source openings each have a nozzle shape.

As a result of a plurality of vapor deposition source openings being arranged in the first direction, in the first direction, variations in the thickness of the coating film formed on the substrate can be reduced.

In the present invention, "nozzle shape" means that the inner circumferential surface of an opening through which vapor deposition particles are discharged has a cylindrical shape or a shape similar to the cylindrical shape (for example, a tapered shape or the like), and its planar shape as viewed in a direction in which the vapor deposition particles are discharged can be any shape such as a circle, an ellipse, any polygon or the like.

In the above, the plurality of vapor deposition source openings may be arranged at the same pitch as a pitch of the plurality of control plates.

With this configuration, a plurality of vapor deposition source openings and a plurality of control plates are disposed in the first direction at the same pitch, and thus the relative positional relationship between the vapor deposition source openings and the control plates is constant in the first direction. Accordingly, variations in the thickness of the coating film, which are caused by a difference in the relative positional relationship between the vapor deposition source openings and the control plates, can be reduced.

Alternatively, the plurality of vapor deposition source openings may be arranged at a pitch that is an integer multiple (i.e., 2 times, 3 times, 4 times, . . . ) of a pitch of the plurality of control plates.

With this configuration, even in the case where it is not possible to reduce the pitch of the vapor deposition source openings due to the opening diameter of the vapor deposition source openings or the processing technique for forming vapor deposition source openings, the pitch of the control plates can be made small. As a result, blur that occurs at the edge of the coating film can be suppressed.

Also, in the first direction, variations in the thickness of the coating film formed on the substrate can be further reduced as compared to the case where the plurality of vapor deposition source openings and the plurality of control plates are disposed at random.

Alternatively, the plurality of vapor deposition source openings may be arranged at a pitch that is a unit fraction (i.e., one-half, one-third, one-fourth, . . . ) of a pitch of the plurality of control plates.

With this configuration, a plurality of vapor deposition source openings are arranged so as to oppose a single inter-control plate space, and thus in the first direction, variations in the thickness of the coating film formed on the substrate can be further reduced.

In the case where a plurality of vapor deposition source openings having a nozzle shape are arranged in the first direction, it is preferable that in the first direction, the vapor deposition source opening is arranged at a center of neighboring control plates.

With this preferred configuration, the inter-control plate space is arranged right in front of (directly above) the vapor deposition source opening where the vapor deposition particle density is the highest. Accordingly, the amount of vapor deposition particles that collide with and are captured by the control plates can be reduced, and thus reduction of the material utilization efficiency and the vapor deposition rate can be prevented.

In this case, it is preferable that the vapor deposition particles discharged from the vapor deposition source opening pass through only a single inter-control plate space located right in front of the vapor deposition source opening.

With this preferred configuration, the length (the dimension in a direction orthogonal to the first direction and the second direction) of the control plates can be shortened. Accordingly, the distance from the vapor deposition source openings to the substrate can be reduced, which is advantageous in improvement of the vapor deposition rate and reduction of the device size.

Alternatively, the vapor deposition particles discharged from the vapor deposition source opening may pass through only a single inter-control plate space located right in front of the vapor deposition source opening and inter-control plate spaces located on both sides of the inter-control plate space.

With this preferred configuration, a large number of vapor deposition particle flows are formed by the control plates splitting the vapor deposition particles into smaller groups, and the large number of vapor deposition particle flows overlap on the substrate, forming the coating film. Accordingly, variations or the like in the vapor deposition particle density between vapor deposition particle flows are averaged, improving the uniformity of the thickness of the coating film.

Also, it can be designed such that the width of edge blur in the coating film is not dependent on the opening diameter of the vapor deposition source openings, the interval in the normal line direction of the substrate between the vapor deposition source openings and the control plates and the like, and thus variations in the blur width can be reduced.

In the case where a plurality of vapor deposition source openings having a nozzle shape are arranged in the first direction, it is preferable that the control plate is disposed right in front of the vapor deposition source opening.

With this preferred configuration, by reducing the thickness of the control plates, reduction in the material utilization efficiency due to provision of the control plates can be reduced.

Also, it can be designed such that the width of edge blur in the coating film is not dependent on the opening diameter of the vapor deposition source openings, the interval in the normal line direction of the substrate between the vapor deposition source openings and the control plates and the like, and thus variations in the blur width can be reduced.

In this case, it is preferable that the vapor deposition particles discharged from the vapor deposition source opening pass through only two inter-control plate spaces located on both sides of the control plate disposed right in front of the vapor deposition source opening.

With this preferred configuration, two vapor deposition particle flows are formed by the control plates splitting the vapor deposition particles into smaller groups, and the plurality of vapor deposition particle flows overlap with each other on the substrate, forming the coating film. Accordingly, variations or the like in the vapor deposition particle density between vapor deposition particle flows are averaged, improving the uniformity of the thickness of the coating film.

Also, it is preferable that the vapor deposition source opening has an opening diameter greater than a thickness of the control plate disposed right in front of the vapor deposition source opening.

With this preferred configuration, the vapor deposition particles discharged from a vapor deposition source opening fly out and arrive even at a region on the substrate which opposes the control plate disposed right in front of the vapor deposition source opening, and therefore the nonuniformity of the thickness of the coating film can be improved.

In the case where a plurality of vapor deposition source openings having a nozzle shape are arranged in the first direction, it is preferable that in the vapor deposition step, either one of the plurality of vapor deposition source openings and the plurality of control plates is moved relative to the other.

With this preferred configuration, the relative positional relationship between the vapor deposition source openings and the control plates is changed with time, and thus variations in the vapor deposition particle density caused by the relative positional relationship are averaged. Also, the vapor deposition source openings and/or the control plates from which vapor deposition particles that reach a certain location on the substrate are derived are changed with time, and thus variations in the vapor deposition particle density caused by variations in the accuracy of the vapor deposition source openings and/or the control plates are averaged. As a result, variations in the thickness of the coating film formed on the substrate can be reduced.

Also, in the case where a plurality of vapor deposition source openings having a nozzle shape are arranged in the first direction, it is preferable that in the vapor deposition step, both the plurality of vapor deposition source openings and the plurality of control plates are moved relative to the vapor deposition mask.

With this preferred configuration, the relative positional relationship of the vapor deposition source openings and the control plates with respect to the vapor deposition mask is changed with time, and thus variations in the vapor deposition particle density caused by the relative positional relationship are averaged. Also, the vapor deposition source openings and the control plates from which vapor deposition particles that reach a certain location on the substrate are derived are changed with time, and thus variations in the vapor deposition particle density caused by variations in the accuracy of the vapor deposition source openings and the control plates are averaged. As a result, variations in the thickness of the coating film formed on the substrate can be reduced.

In the cases described above, it is preferable that a direction of the relative movement is the first direction.

With this preferred configuration, the nonuniformity of the thickness of the coating film can be improved.

Also, the width of edge blur in the coating film is not dependent on the opening diameter of the vapor deposition source openings, the interval in the normal line direction of the substrate between the vapor deposition source openings and the control plates, and the like, and thus variations in the blur width can be reduced.

It is preferable that the relative movement is a reciprocal movement.

With this preferred configuration, variations in the vapor deposition particle density can be averaged without making the device gigantic.

It is preferable that an amount of travel by the reciprocal movement is greater than the greater one of a pitch of the plurality of vapor deposition source openings and a pitch of the plurality of control plates.

With this preferred configuration, variations in the vapor deposition particle density can be further averaged, further improving the nonuniformity of the thickness of the coating film.

Alternatively, It is preferable that an amount of travel by the reciprocal movement is an integer multiple (i.e., 2 times, 3 times, 4 times, . . . ) of the greater one of a pitch of the plurality of vapor deposition source openings and a pitch of the plurality of control plates.

With this preferred configuration, variations in the vapor deposition particle density can be further averaged, further improving the nonuniformity of the thickness of the coating film.

In the vapor deposition method of the present invention described above, it is preferable that the vapor deposition source opening has a slot shape extending in the first direction, and the vapor deposition source opening has an opening diameter in the first direction larger than a pitch of the plurality of control plates.

With this preferred configuration, the vapor deposition rate can be improved as compared to the case where the vapor deposition source openings have a nozzle shape. Also, the nonuniformity of the thickness of the coating film can be further improved as compared to the case where the vapor deposition source openings has a nozzle shape.

It is preferable that in the vapor deposition step, the plurality of control plates are cooled.

With this preferred configuration, the vapor deposition particles that have collided with the control plates can be captured reliably, and re-vaporization of the vapor deposition particles from the control plates can be prevented. Also, the control plates can be prevented from deformation and dimensional changes caused by the control plates being heated by radiant heat from the vapor deposition source. As a result, the width of edge blur in the coating film can be prevented from growing.

It is preferable that in the vapor deposition step, a temperature of the plurality of control plates is adjusted to a predetermined temperature.

With this preferred configuration, the material utilization efficiency can be further improved by causing the vapor deposition particles that have captured by the control plates to re-vaporize.

In the vapor deposition method of the present invention described above, it is preferable that the coating film is a light emitting layer for an organic EL element.

With this preferred configuration, it is possible to provide an organic EL display device in which the occurrence of color mixing and nonuniform light emission is suppressed.

Hereinafter, the present invention will be described in detail by showing preferred embodiments and examples. It should be noted, however, that the present invention is not limited to the following embodiments and examples. For the sake of convenience of the description, the drawings referred to hereinafter show only the principal members required to describe the present invention in simplified form among the constituent members of the embodiments and the examples of the present invention. Accordingly, the present invention may include arbitrary constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
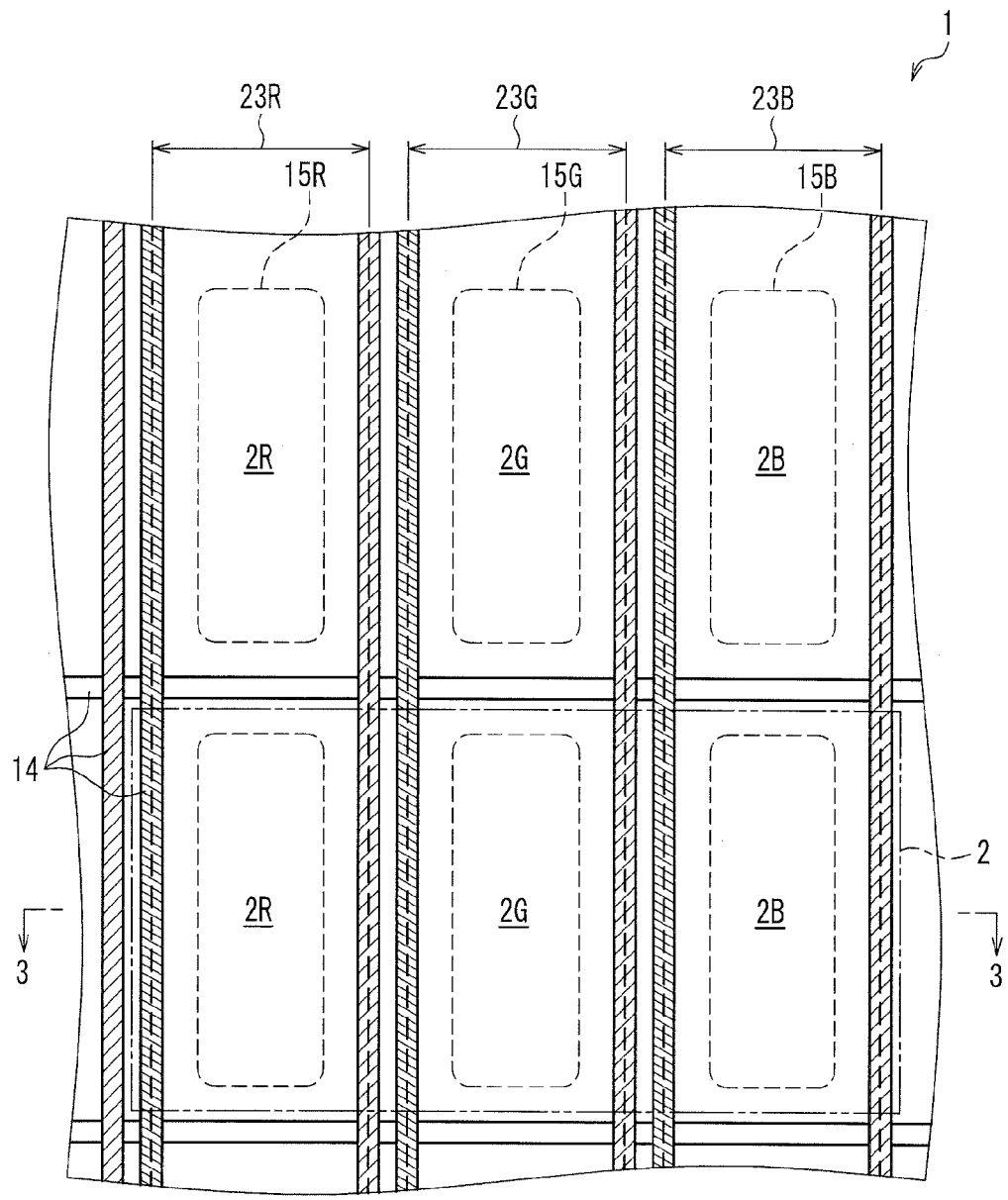
FIG. 2 is a plan view showing a configuration of pixels that constitute the organic EL display device shown in FIG. 1.
Figure 3:
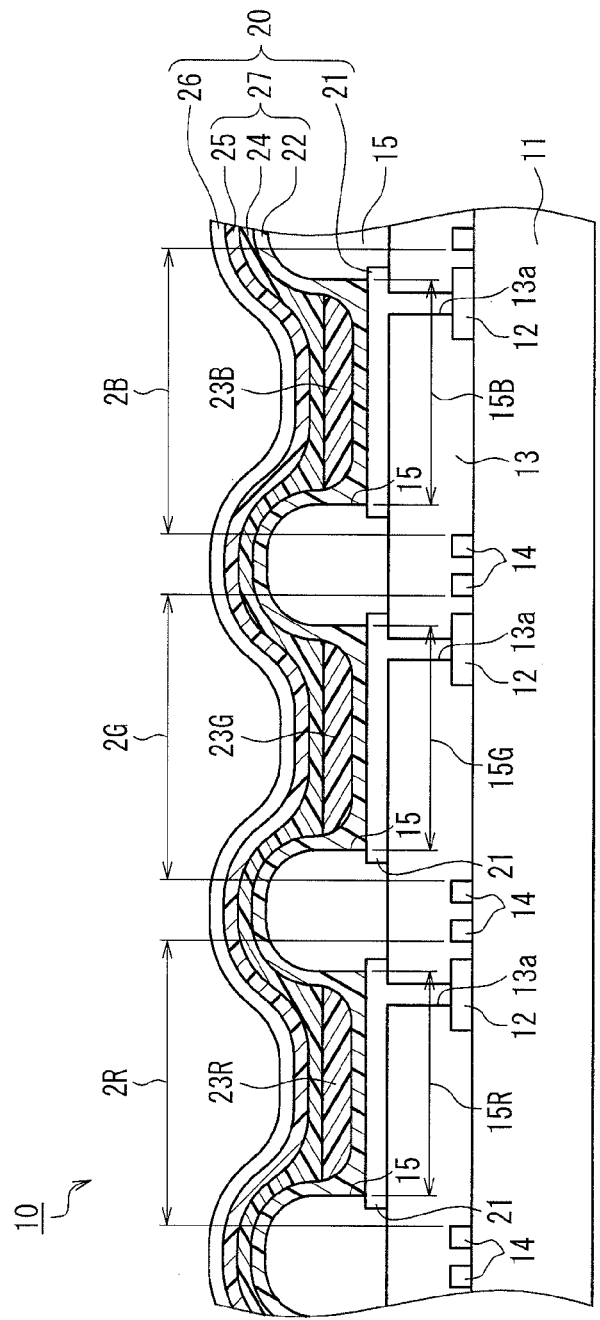
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the perpendicular direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the light emitting layers 23R, 23G and 23B. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the light emitting layers 23R, 23G and 23B.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
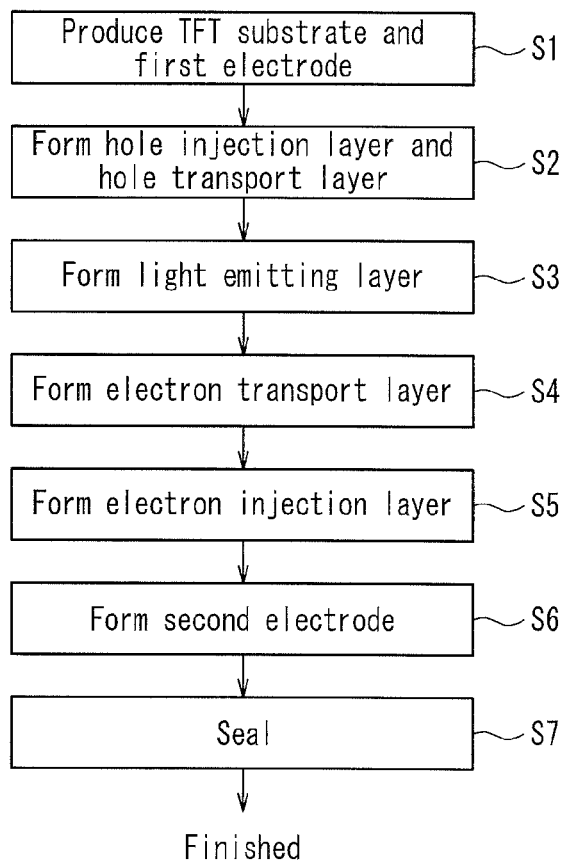
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, polysilane-based compounds, vinylcarbazole-based compounds, heterocyclic conjugated monomers, oligomers or polymers such as thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
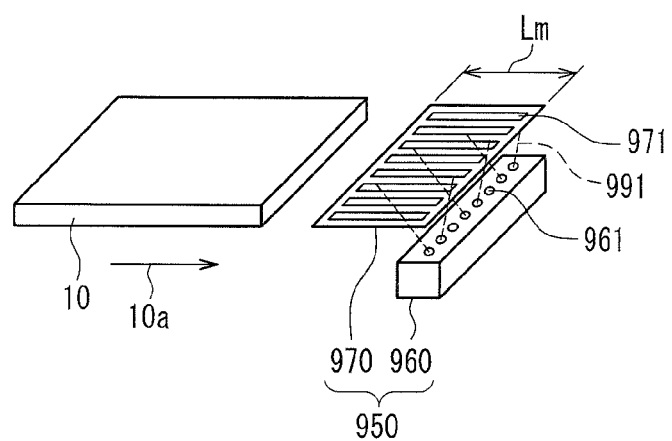
FIG. 5 is a perspective view showing the basic concept of a new vapor deposition method.

FIG. 5 is a perspective view showing the basic concept of the new vapor deposition method.

A vapor deposition source 960 and a vapor deposition mask 970 together constitute a vapor deposition unit 950. The relative position between the vapor deposition source 960 and the vapor deposition mask 970 is constant. A substrate 10 is moved at a constant speed in a direction indicated by 10a on the opposite side across the vapor deposition mask 970 from the vapor deposition source 960. A plurality of vapor deposition source openings 961 through which vapor deposition particles 991 are discharged are formed on the upper surface of the vapor deposition source 960. A plurality of mask openings 971 are formed in the vapor deposition mask 970. The vapor deposition particles 991 discharged from the vapor deposition source openings 961 pass through the mask openings 971 and adhere to the substrate 10. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension Lm of the vapor deposition mask 970 in the movement direction 10a of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

However, the present inventors found, as a result of a further investigation, the new vapor deposition method shown in FIG. 5 is problematic in that a blur is more likely to occur at the edges of the formed coating film (vapor deposition film) as compared to the vapor deposition methods of Patent Documents 1 and 2. The cause of this problem will be described below.

Figure 6:
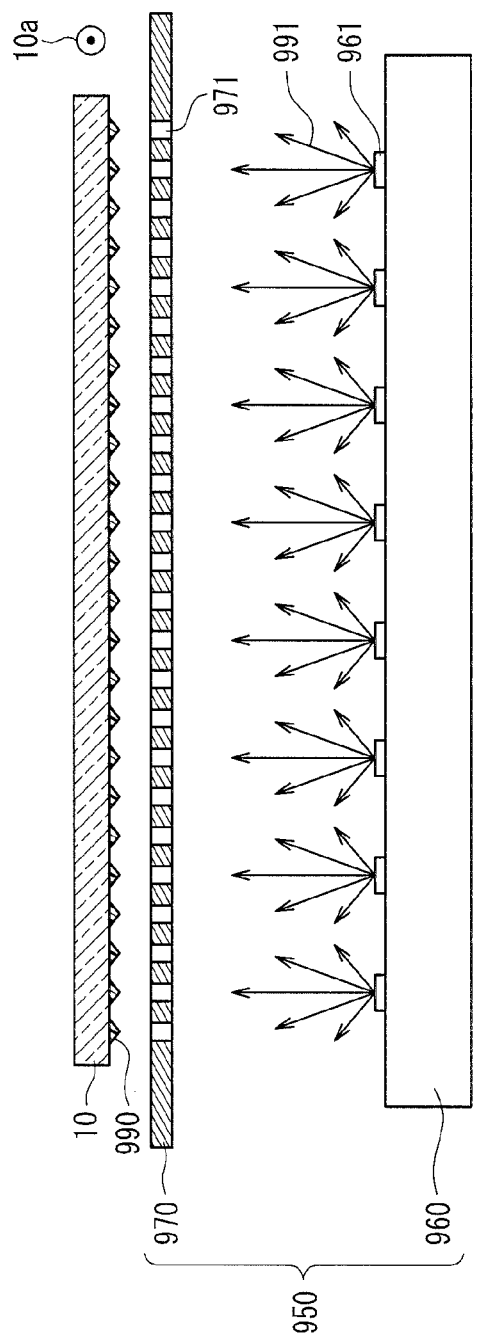
FIG. 6 is a front cross-sectional view of the vapor deposition device shown in FIG. 5 as viewed in a direction parallel to the movement direction of a substrate.

FIG. 6 is a cross-sectional view of the vapor deposition device shown in FIG. 5 as viewed in a plane perpendicular to the movement direction 10a of the substrate 10. A plurality of vapor deposition source openings 961 and a plurality of the mask opening 971 are arranged in the right-left direction of FIG. 6. The vapor deposition particles 991 from each vapor deposition source opening 961 are discharged over a certain range (directivity). Specifically, in FIG. 6, the number of vapor deposition particles 991 discharged from each vapor deposition source opening 961 is the greatest in a direction directly above the vapor deposition source opening 961 and gradually decreases as the angle (departure angle) formed with respect to the straight upward direction increases. The vapor deposition particles 991 discharged from the vapor deposition source openings 961 travel straight in their discharged direction. In FIG. 6, the flow of vapor deposition particles 991 discharged from the vapor deposition source openings 961 is conceptually indicated by arrows. Accordingly, each mask opening 971 mostly receives, but not necessarily limited thereto, the vapor deposition particles 991 discharged from the vapor deposition source opening 961 located directly below the mask opening 971 and also receives the vapor deposition particles 991 discharged from the vapor deposition source openings 961 located obliquely downward.

Figure 7:
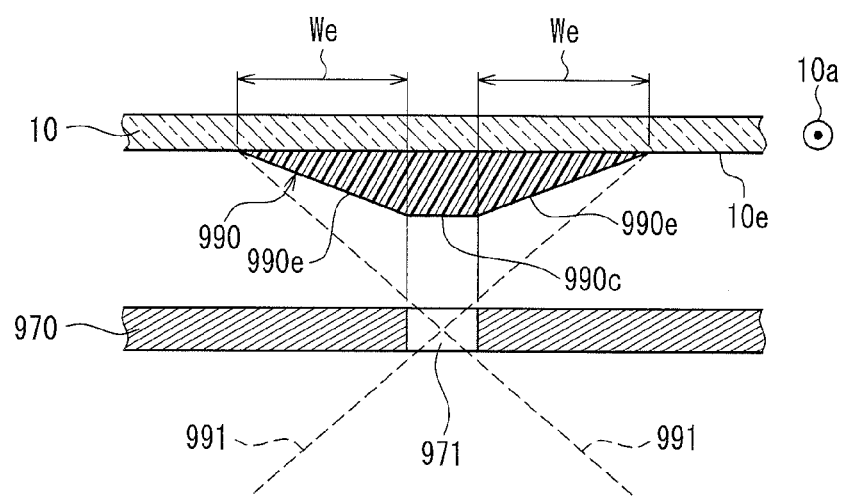
FIG. 7 is a cross-sectional view illustrating the cause of blur generated at the edges of a coating film in the new vapor deposition method shown in FIG. 5.

FIG. 7 is a cross-sectional view of a coating film 990 formed on a substrate 10 by vapor deposition particles 991 that have passed through a mask opening 971, as viewed in a plane perpendicular to the movement direction 10a of the substrate 10 as in FIG. 6. As described above, the vapor deposition particles 991 coming from various directions pass through the mask opening 971. The number of vapor deposition particles 991 that reach a deposition surface 10e of the substrate 10 is the greatest in a region directly above the mask opening 971 and gradually decreases as the position gets farther away therefrom. Accordingly, as shown in FIG. 7, on the deposition surface 10e of the substrate 10, a coating film main portion 990c having a sizable and substantially constant thickness is formed in the region where the mask opening 971 is projected onto the substrate 10 from directly above, and a blur portion 990e that is gradually thinner as the position gets farther away from the coating film main portion 990c is formed on both sides of the coating film main portion 990c.

If the blur portion 990e extends to the neighboring light emitting layer region having a different color due to an increase in the width We of the blur portion 990e, it causes "color mixing" or degradation of the characteristics of the organic EL element.

Accordingly, it is necessary to prevent the blur portion 990e from extending to the neighboring light emitting layer region.

Figure 8:
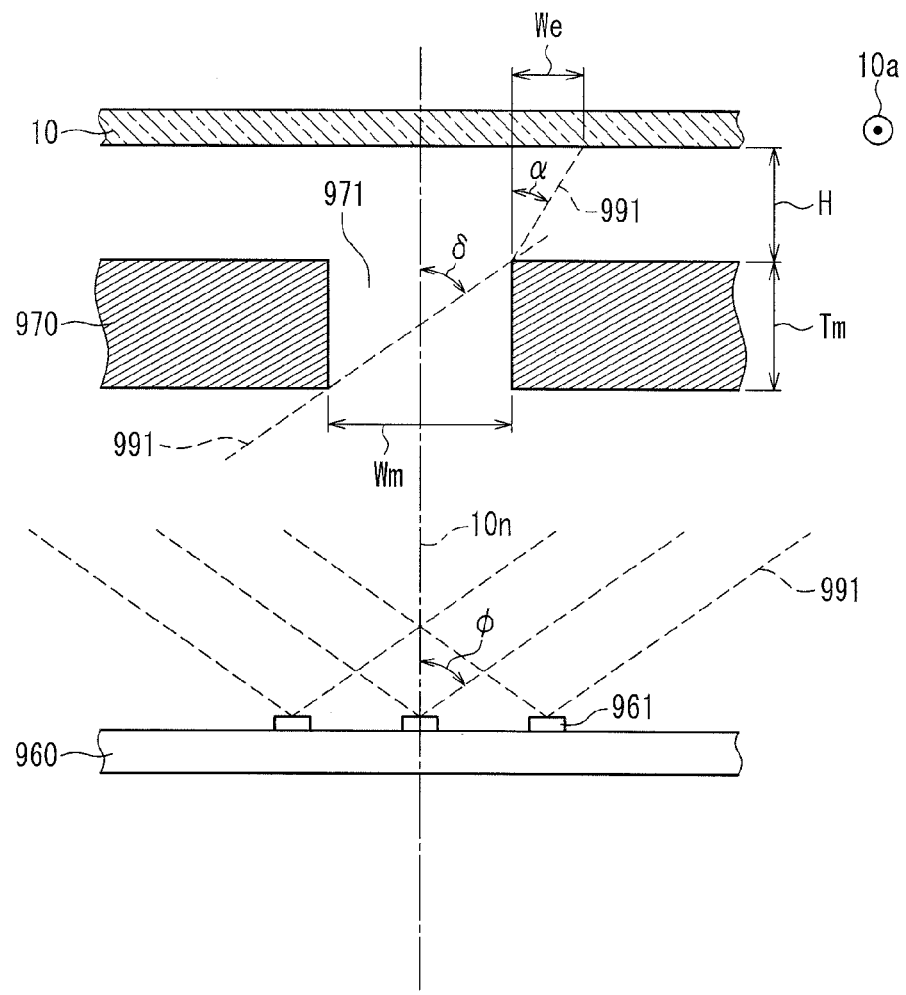
FIG. 8 is a cross-sectional view of the vapor deposition device shown in FIG. 5 as viewed in a direction parallel to the scanning direction of a substrate, showing the flight directions of vapor deposition particles.

As shown in FIG. 8, the greatest incidence angle of the vapor deposition particles 991 that have passed through the mask opening 971 with respect to the substrate 10 as viewed in a direction parallel to the movement direction 10a of the substrate 10 is represented by α (maximum incidence angle). Here, the incidence angle of the vapor deposition particles 991 is defined by the angle formed between the flight direction of the vapor deposition particles 991 and a normal line 10n of the substrate 10. The width We of the blur portion 990e shown in FIG. 7 is expressed by $$We = H \times \tan \alpha,$$

where the interval between the vapor deposition mask 970 and the substrate 10 is denoted by H.

Accordingly, in order to reduce the width We of the blur portion 990e, it is sufficient to reduce either one of the interval H between the vapor deposition mask 970 and the substrate 10 and the maximum incidence angle α of the vapor deposition particles 991 with respect to the substrate 10.

However, if the interval H between the vapor deposition mask 970 and the substrate 10 is reduced, the possibility increases that the vapor deposition mask 970 and the substrate 10 might collide with each other. In order to reduce the interval H without causing a collision between the substrate 10 and the vapor deposition mask 970 when the substrate 10 is moved with respect to the vapor deposition mask 970, it is necessary to control the position of the substrate 10 with respect to the vapor deposition mask 970, with high accuracy. Accordingly, there is a limit to the reduction of the interval H.

The maximum incidence angle α, on the other hand, is determined by the departure angle of the vapor deposition particles 991 discharged from the vapor deposition source opening 961 or the aspect ratio of the mask opening 971.

The departure angle of the vapor deposition particles 991 is defined by the angle formed between the flight direction of the vapor deposition particles 991 discharged from the vapor deposition source opening 961 and the normal line 10n of the substrate 10 as viewed in a direction parallel to the movement direction 10a of the substrate 10 as shown in FIG. 8. As described above, the vapor deposition particles 991 are discharged from the vapor deposition source opening 961 toward various directions. Generally, the amount of vapor deposition particles traveling directly above a vapor deposition source opening 961 (the vapor deposition particles having a departure angle of 0 degrees) is the greatest and gradually decreases as the departure angle increases. The departure angle of the vapor deposition particles 991 having the greatest value is represented by Φ (maximum departure angle).

The aspect ratio of the mask opening 971, on the other hand, is defined by the ratio (Tm/Wm) of thickness Tm of the vapor deposition mask 970 to opening width Wm of the mask opening 971 when the mask opening 971 is viewed in a direction parallel to the movement direction 10a of the substrate 10 as shown in FIG. 8. The aspect ratio of the mask opening 971 can be represented by $\cot \delta$, where the greatest angle formed between the flight direction of the vapor deposition particles 991 that can pass through the mask opening 971 and the normal line 10n of the substrate 10 is denoted by δ.

If $\Phi \geq \delta$ is satisfied, the maximum incidence angle α of the vapor deposition particles is dependent on the aspect ratio $\cot \delta$ of the mask opening 971 (or in other words, $\alpha = \delta$).

Accordingly, by increasing the aspect ratio $\cot \delta$, the maximum incidence angle α of the vapor deposition particles can be reduced.

However, the following problems arise if the aspect ratio $\cot \delta$ of the mask opening 971 is increased.

The first problem is that due to the thickness Tm of the vapor deposition mask 970 being large, the vapor deposition particles easily adhere to the inner circumferential surface of the mask opening 971, as a result of which the substantial opening dimension becomes small, and in the worst case, the mask opening 971 is clogged. For example, in order to reduce the width We of the blur portion 990e to 50 μm or less when the interval H between the vapor deposition mask 970 and the substrate 10 is 0.5 mm, it is necessary to satisfy $\alpha = \delta \approx 5.7°$. Accordingly, $\cot \delta \approx 10$ is obtained. In the mask opening 971 whose inner circumferential surface is parallel to the normal line 10n of the substrate 10 as shown in FIG. 8, when the opening width Wm of the mask opening 971 is set to 90 μm, the thickness Tm of the vapor deposition mask 970 needs to be 900 μm in order to satisfy $\cot \delta \approx 10$. This requires the vapor deposition mask 970 to be made so as to be 9 to 90 times thicker than a commonly used vapor deposition mask having a thickness of 10 to 100 μm. The amount of vapor deposition particles that adhere to the inner circumferential surface of the mask opening 971 increases as the thickness Tm of the vapor deposition mask 970 is increased.

The second problem is that it becomes difficult to manufacture the vapor deposition mask 970 as the aspect ratio increases. Generally, a metal is used as the material for the vapor deposition mask 970, in consideration of heat resistance, workability and thermal expansion coefficient. As the method for forming the mask opening 971 whose inner circumferential surface is substantially orthogonal to the surface, an electroforming method, a boring method such as laser cutting, or the like is used. It is difficult to form an opening having a high aspect ratio in a metal board by using such a method, and technical difficulty is involved in achieving, for example, a highly accurate opening having an aspect ratio $\cot \delta$ of 3 or greater. Accordingly, it is extremely difficult to form a large number of mask openings 971 in a metal plate having a thickness Tm of 900 μm as in the above example with high accuracy. Also, even if such a vapor deposition mask is successfully made, the cost for manufacturing the vapor deposition mask will be high, and thus the cost for an organic EL display device manufactured by using the vapor deposition mask will be high.

The third problem is that the increase in the aspect ratio increases the thickness of the vapor deposition mask 970 and eventually increases the weight of the vapor deposition mask 970, as a result of which conspicuous bending and deformation can occur in the vapor deposition mask 970 by its own weight. If the vapor deposition mask 970 is deformed by its own weight, the interval H between the vapor deposition mask 970 and the substrate 10 varies depending on the position on the surface of the vapor deposition mask 970, and thus the width We of the blur portion 990e cannot be constant in the surface of the substrate 10.

Accordingly, there is a limit to the increase of the aspect ratio $\cot \delta$ of the mask opening 971. It can be seen that it is difficult to reduce the maximum incidence angle α of the vapor deposition particles by increasing the aspect ratio $\cot \delta$.

In contrast, if $\Phi < \delta$ is satisfied, the maximum incidence angle α of the vapor deposition particles is dependent on the maximum departure angle Φ of the vapor deposition particles (or in other words, $\alpha = \Phi$). Accordingly, by reducing the maximum departure angle Φ, the maximum incidence angle α of the vapor deposition particles can be reduced.

Generally, it is considered that the maximum departure angle Φ can be adjusted by the shape of the vapor deposition source opening 961. It is, however, not easy to reduce the maximum departure angle Φ as imagined.

Patent Document 3 states that by forming a vapor deposition source opening so as to have a tapered cross-sectional shape whose diameter increases toward the substrate, a vapor deposition film having a thickness distribution having a sharp peak can be formed at the position right in front of the vapor deposition source opening. However, as shown in FIG. 4 of Patent Document 3, in the case where the vapor deposition source opening having a tapered cross-sectional shape is used, the thickness distribution near the portion having the greatest vapor deposition film thickness does become sharp as compared to the case where a vapor deposition source opening having a constant diameter is used, but the vapor deposition film forming region (or in other words, the range where the vapor deposition particles adhere) is about the same. That is, even if the shape of the vapor deposition source opening is changed so as to have a tapered cross section described in Patent Document 3, the maximum departure angle Φ shows little change.

Patent Document 4 states that a vapor deposition beam direction adjustment plate having vapor deposition beam-pass-through holes formed therein is disposed between a vapor deposition source and a vapor deposition mask. By causing the vapor deposition particles discharged from the vapor deposition source to pass through the vapor deposition beam-pass-through holes formed in the vapor deposition beam direction adjustment plate, the directivity of vapor deposition beam is increased. Patent Document 4 states that the vapor deposition beam-pass-through holes preferably have a diameter of about 0.1 mm to 1 mm, in order to sufficiently increase the directivity. However, the use of the vapor deposition beam direction adjustment plate having vapor deposition beam-pass-through holes of such a small diameter causes problems similar to those when the aspect ratio of the mask opening 971 is increased as described above. Specifically, due to having a small diameter, the vapor deposition beam-pass-through holes are likely to be clogged as a result of the vapor deposition particles adhering to the inner circumferential surface of the vapor deposition beam-pass-through holes. Also, it is technically difficult to form a large number of vapor deposition beam-pass-through holes having a small diameter with high accuracy, and it requires high cost. If the diameter of the vapor deposition beam-pass-through holes is increased in order to improve workability, the vapor deposition beam direction adjustment plate needs to be made thick in order to obtain the desired directivity of vapor deposition beam. As a result, the vapor deposition beam direction adjustment plate will be bent or deformed by its own weight, making the directivity and the width of blur portions nonuniform. Furthermore, there will be a large amount of vapor deposition particles that cannot pass through the vapor deposition beam-pass-through holes, decreasing the vapor deposition rate and the utilization efficiency of the vapor deposition material. If the vapor deposition beam direction adjustment plate is applied to the new vapor deposition method shown in FIG. 5, even in a direction that is parallel to the movement direction 10*a* of the substrate 10 and in which it is unnecessary to increase the directivity of vapor deposition beam, vapor deposition beam beams with low directivity will be captured, causing an undesirable decrease in the utilization efficiency of the vapor deposition material.

As described above, the new vapor deposition method shown in FIG. 5 is advantageous in that vapor deposition by color can be performed on a large-sized substrate, but it is difficult to reduce the width We of the blur portion 990*e* while preventing reduction of the utilization efficiency of the vapor deposition material at the same time. In order to prevent the blur portion 990*e* from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

The present inventors conducted an in-depth investigation to solve the above problems encountered with the new vapor deposition method and the present invention has been accomplished. Hereinafter, preferred embodiments of the present invention will be described.

(Embodiment 1)

Figure 9:
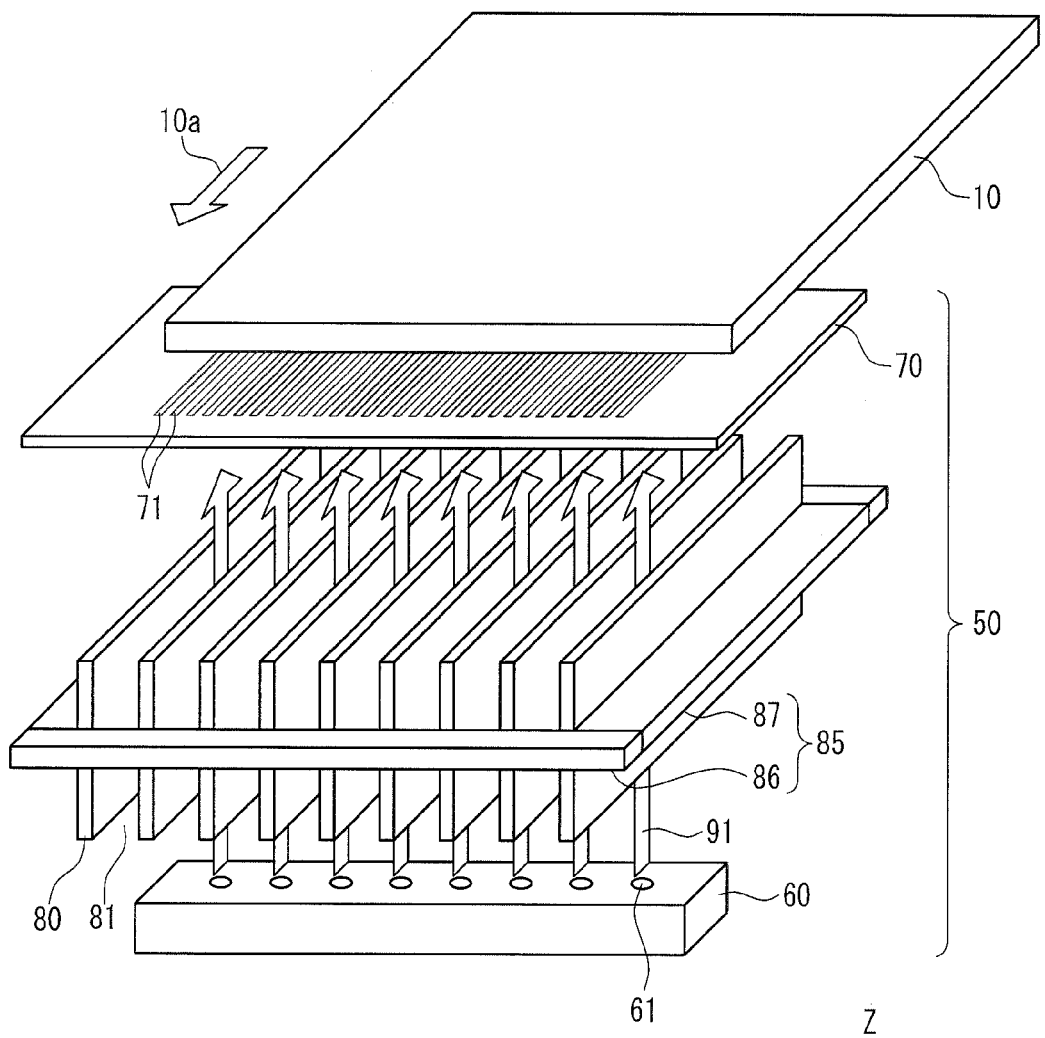
FIG. 9 is a perspective view showing principal parts of a vapor deposition device according to Embodiment 1 of the present invention.
Figure 10:
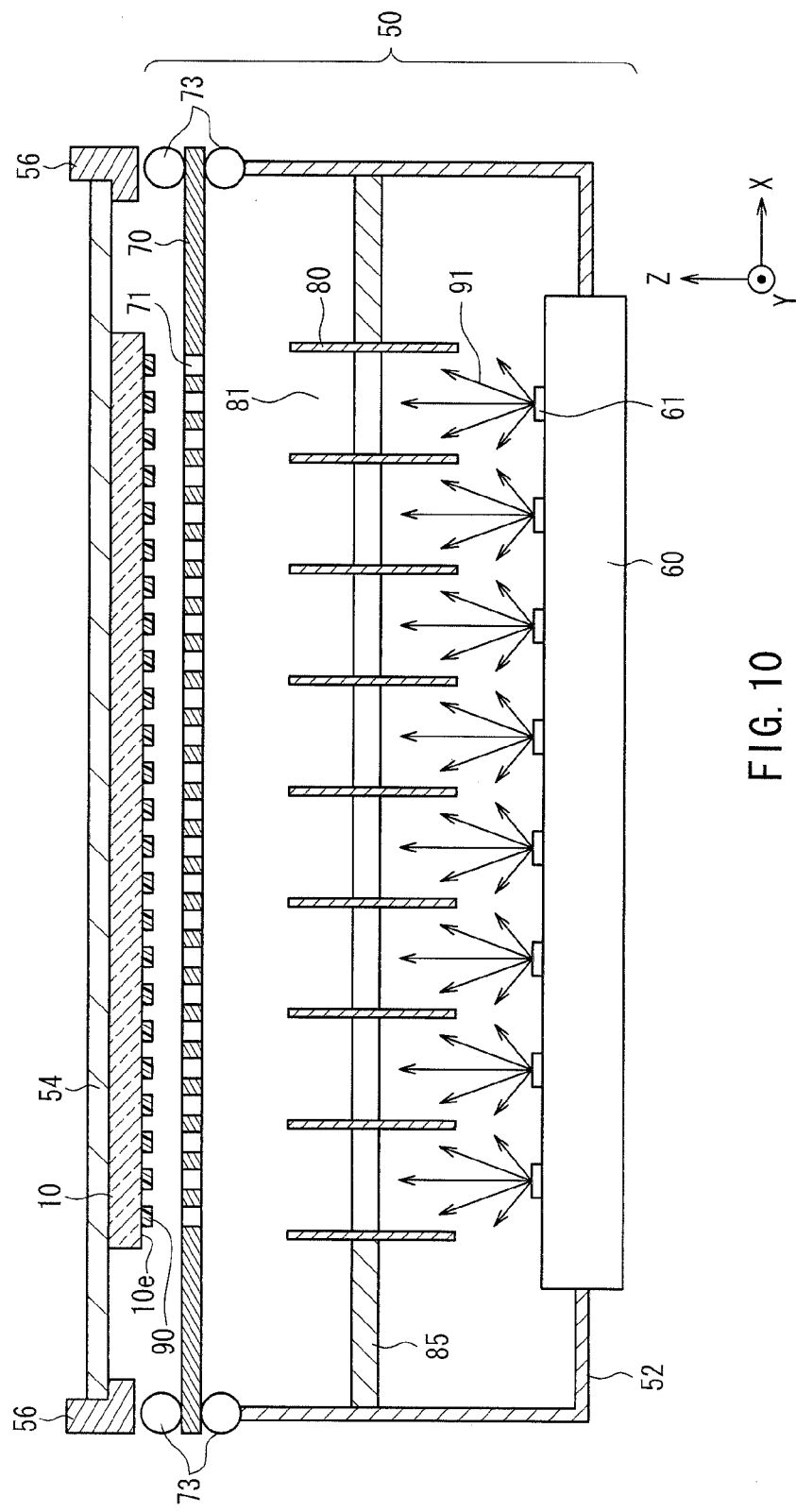
FIG. 10 is a front view of the vapor deposition device according to Embodiment 1 of the present invention as viewed in the scanning direction of a substrate.
Figure 11:
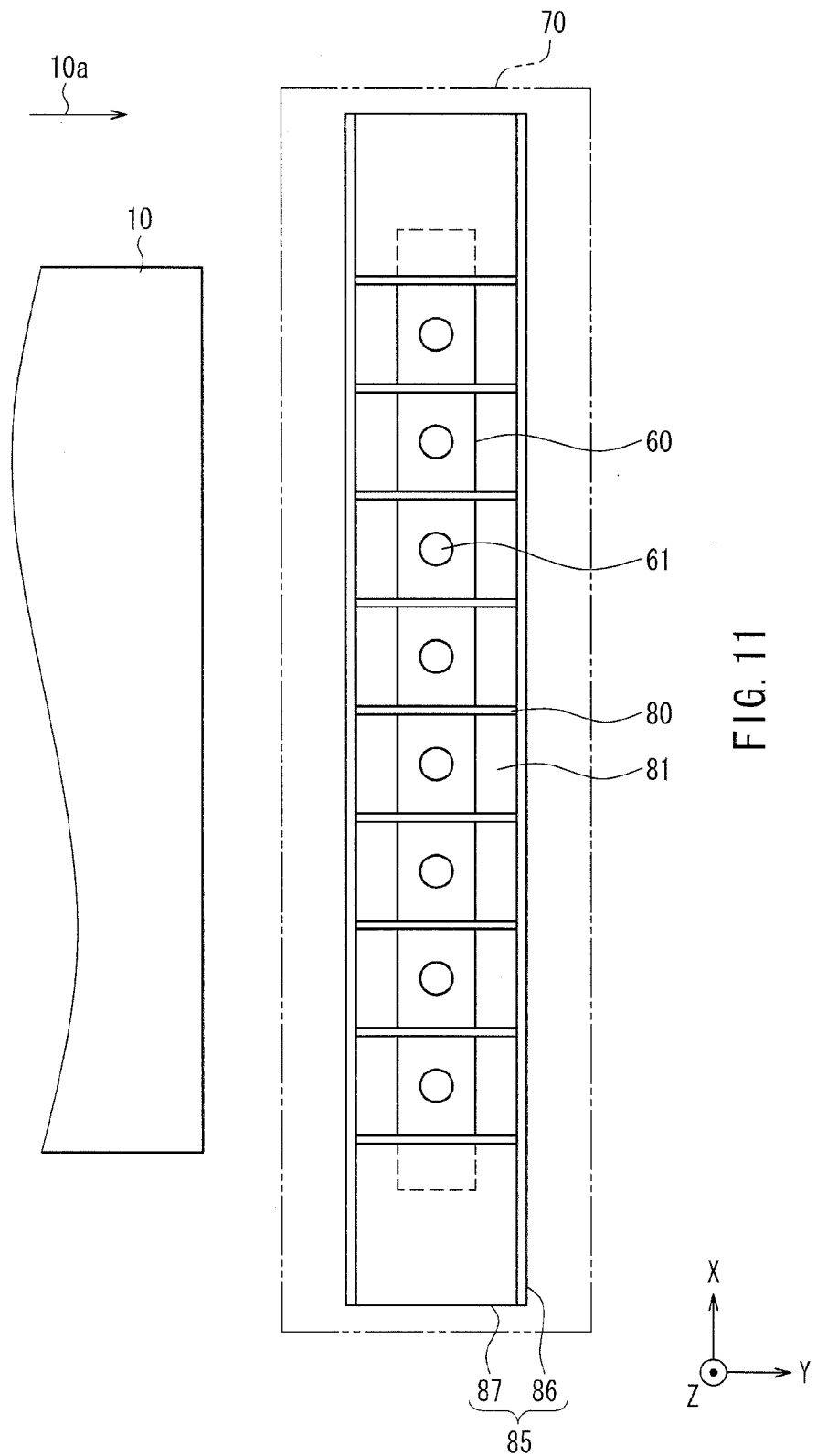
FIG. 11 is a plan view of the vapor deposition device according to Embodiment 1 of the present invention.

FIG. 9 is a perspective view showing principal parts of a vapor deposition device according to Embodiment 1 of the present invention. FIG. 10 is a front view of the vapor deposition device according to Embodiment 1 as viewed in a direction perpendicular to a width direction (first direction) of a substrate 10. FIG. 11 is a plan view of the vapor deposition device according to Embodiment 1 (illustration of a vapor deposition mask 70 is omitted). For the sake of convenience of the description given below, an XYZ orthogonal coordinate system is set in which a horizontal axis extending along the width direction of the substrate 10 is defined as the X axis, a horizontal axis perpendicular to the X axis is defined as the Y axis, and an up-down direction axis parallel to the X axis and the Y axis is defined as the Z axis. The Z axis is parallel to the normal line direction of the deposition surface 10*e* of the substrate 10. To facilitate the description, the side to which the arrow indicating the Z axis points (the upper side of FIG. 9) is referred to the "upper side".

A vapor deposition mask 70 is disposed so as to oppose a vapor deposition source 60 in the Z axis direction. A plurality of control plates 80 are disposed between the vapor deposition source 60 and the vapor deposition mask 70.

The vapor deposition source 60 has a plurality of vapor deposition source openings 61 in its upper surface (the surface facing the vapor deposition mask 70). The plurality of vapor deposition source openings 61 are arranged at a fixed pitch in the X axis direction. Each vapor deposition source opening 61 has a nozzle shape that is upwardly open parallel to the Z axis and discharges vapor deposition particles 91, which are a light emitting layer-forming material, toward the vapor deposition mask 70.

The vapor deposition mask 70 is a plate-shaped piece that has a major surface (the surface having the largest area) parallel to the XY plane and in which a plurality of mask openings 71 are formed along the X axis direction at different positions in the X axis direction. In the present embodiment, each mask opening 71 has an opening shape having a slot shape that is parallel to the Y axis, but the present invention is not limited thereto.

The vapor deposition mask 70 is held by a mask tension mechanism 73 (see FIG. 10). The mask tension mechanism 73 applies tension to the vapor deposition mask 70 in a direction parallel to the major surface, thereby preventing the occurrence of slack and stretch of the vapor deposition mask 70 due to its own weight.

The plurality of control plates 80 are disposed at a fixed pitch in the X axis direction. The plurality of control plates 80 are thin plates that have the same dimensions and whose major surface (the surface having the largest area) is perpendicular to the deposition surface 10e of the substrate 10 and parallel to the Y axis direction.

In the present embodiment, the pitch in the X axis direction between the plurality of control plates 80 is the same as the pitch in the X axis direction between the plurality of vapor deposition source openings 61. The positions in the X axis direction of a control plate 80 and a vapor deposition source opening 61 are set such that the control plate 80 and the vapor deposition source opening 61 are offset by one half of the pitch in the X axis direction. In other words, a single vapor deposition source opening 61 is arranged at a center position between two neighboring control plates 80 that are adjacent in the X axis direction.

The plurality of control plates 80 are held integrally by a frame-shaped holding body 85 by way of, for example, welding or the like, the frame-shaped holding body 85 being composed of a pair of first holding members 86 that are parallel to the X axis direction and a pair of second holding members 87 that are parallel to the Y axis direction (see FIG. 9). However, the method for holding the plurality of control plates 80 is not limited thereto as long as the relative position and orientation of the plurality of control plates 80 can be maintained constant.

The vapor deposition source opening 61 and the plurality of control plates 80 are spaced apart from each other in the Z axis direction, and the plurality of control plates 80 and the vapor deposition mask 70 are spaced apart from each other in the Z axis direction. The relative position between the vapor deposition source 60, the vapor deposition mask 70 and the plurality of control plates 80 is constant at least during vapor deposition by color, and these elements constitute a vapor deposition unit 50. For example, as shown in FIG. 10, by integrally holding the vapor deposition source 60, the mask tension mechanism 73 and the holding body 85 by using a holder 52, the relative position between the vapor deposition source 60, the vapor deposition mask 70 and the plurality of control plates 80 can be maintained constant.

As shown in FIG. 10, the substrate 10 is held by a holding device 54. As the holding device 54, for example, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device 54 for holding the substrate 10 is not limited to an electrostatic chuck and may be any other device.

The substrate 10 held by the holding device 54 is scanned (moved) in the Y axis direction (second direction) 10a at a constant speed by a moving mechanism 56 on the opposite side across the vapor deposition mask 70 from the vapor deposition source 60, with the substrate 10 being spaced apart from the vapor deposition mask 70 at a fixed interval. The movement of the substrate 10 may be a reciprocal movement or a single direction movement in which the substrate 10 is moved in either direction. There is no particular limitation on the configuration of the moving mechanism 56. For example, any known transfer driving mechanism can be used such as a linear motor or a feed screw mechanism that rotates a feed screw by a motor.

The vapor deposition unit 50, the substrate 10, the holding device 54 for holding the substrate 10 and the moving mechanism 56 for moving the substrate 10 are housed in a vacuum chamber (not shown). The vacuum chamber is a hermetically sealed container, with its internal space being vacuumed to a predetermined low pressure state and maintained.

The vapor deposition particles 91 discharged from a vapor deposition source opening 61 pass through a space (hereinafter referred to as a "control space") 81 between neighboring control plates 80 that are adjacent in the X axis direction and then through the mask openings 71, and adhere to the deposition surface (or in other words, the surface of the substrate 10 facing the vapor deposition mask 70) 10e of the substrate 10, thereby forming a coating film 90. The coating film 90 has a stripe shape extending in the Y axis direction.

The vapor deposition particles 91 that form the coating film 90 necessarily pass through the control space 81 and the mask openings 71. The control plates 80 and the vapor deposition mask 70 are designed so as to avoid a situation in which the vapor deposition particles 91 discharged from the vapor deposition source opening 61 reach the deposition surface 10e of the substrate 10 without passing through the control space 81 and the mask openings 71, and if necessary, a shielding plate (not shown) or the like that prevents flight of the vapor deposition particles 91 may be installed.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

The action of the control plates 80 will be described.

Similarly as described in FIG. 8, the vapor deposition particles 91 from each vapor deposition source opening 61 are discharged over a certain range (directivity). The vapor deposition particles 91 enter the control space 81. Among the vapor deposition particles 91, those having a large speed vector component in the X axis direction collide with and adhere to the control plates 80 and therefore cannot reach the mask openings 71. That is, on a projection onto the XZ plane, the control plates 80 limit the incidence angle of the vapor deposition particles 91 entering the mask openings 71. As used herein, "incidence angle" of the vapor deposition particles 91 with respect to a mask opening 71 is defined as the angle formed between the flight direction of the vapor deposition particles 91 and the Z axis on a projection onto the XZ plane. As described above, in the present embodiment, the vapor deposition particles 91 that pass through a mask opening 71 at a large incidence angle are reduced. Accordingly, the width We of the blur portions 990e shown in FIG. 7 is reduced, and preferably the occurrence of the blur portions 990e will substantially be prevented, and thus the occurrence of blur at both edges of the stripe-shaped coating film 90 can be suppressed significantly. As a result, in the organic EL display device, the need to increase the width of the non-light-emitting region between light-emitting regions so as to not cause color mixing is eliminated. Accordingly, it is possible to achieve display of high definition and high brightness images. In addition, the need to increase the current density in the light emitting layers in order to enhance brightness is also eliminated, a long service life can be achieved and reliability can be improved.

In order to limit the incidence angle of the vapor deposition particles 91 entering a mask opening 71, the control plates 80, which are thin plates, are used. Accordingly, the dimension in the X axis direction of a control space 81 can be large, and the dimension in the Y axis direction of a control space 81 can be set to substantially any value. This increases the opening area between neighboring control plates 80 that are adjacent in the X axis direction, and thus the amount of vapor deposition particles that adhere to the control plates 80 can be reduced, as a result of which the wasted vapor deposition material can be reduced. Also, clogging caused as a result of the vapor deposition material adhering to the control plates 80 is unlikely to occur, enabling continuous use for a long period of time and improving the mass productivity of the organic EL display device. Furthermore, because the opening area between control plates 80 is large, the vapor deposition material that has adhered to the control plates 80 can be easily washed off, enabling simple maintenance and reducing the losses due to stop of mass production, as a result of which the mass productivity can be further improved.

In the present embodiment, at least a part of the coating film 90 formed on the substrate 10 is formed by the vapor deposition particles 91 that have passed through two or more different control spaces 81. Specifically, the vapor deposition particles 91 that have passed through a plurality of control spaces 81 at different positions in the X axis direction adhere to the same place on the deposition surface 10e of the substrate 10. This will be described below.

Figure 12:
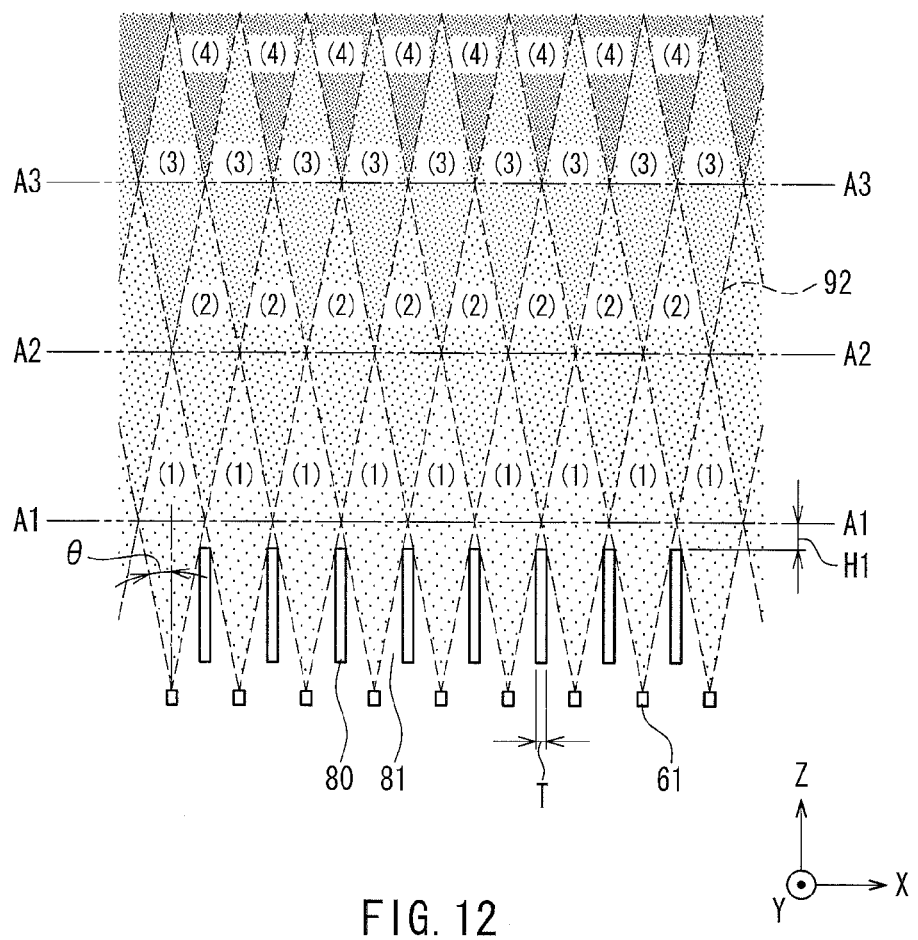
FIG. 12 is a diagram showing an example of vapor deposition particle flows passing through inter-control plate spaces in Embodiment 1 of the present invention.

FIG. 12 is a diagram showing flows 92 of the vapor deposition particles discharged from the vapor deposition source openings 61 (hereinafter referred to as "vapor deposition particle flows") in the vapor deposition device of Embodiment 1, as viewed in a direction parallel to the Y axis. In order to simplify the illustration in FIG. 12, only the vapor deposition source openings 61 and the control plates 80 are shown. As described above, the pitch in the X axis direction between the vapor deposition source openings 61 and the pitch in the X axis direction between the control plates 80 are the same, and in the X axis direction, the position of each vapor deposition source opening 61 matches the center position between two neighboring control plates 80 that are adjacent in the X axis direction. In FIG. 12, the vapor deposition particles discharged from each vapor deposition source opening 61 pass through only a control space 81 located directly above the vapor deposition source opening 61 and cannot pass through control spaces 81 located on both sides of the control space 81. In FIG. 12, a vapor deposition particle flow 92 that can pass through each control space 81 is indicated by a broken line.

As can be understood from FIG. 12, the vapor deposition particle flow 92 passing through a control space 81 has a certain range. Accordingly, on the upper side (the side away from the control plates 80) of the line A1-A1 shown in FIG. 12, two or more vapor deposition particle flows 92 at least partially overlap with each other. By disposing the deposition surface 10e of the substrate 10 in a region on the upper side of the line A1-A1, at least a part of the coating film 90 can be formed by the vapor deposition particles that have passed through two or more different control spaces 81. With this configuration, irrespective of the position of the mask openings 71, the coating film 90 can be formed at the desired position on the deposition surface 10e. It is also possible to improve the uniformity of the thickness of the coating film 90.

As shown in FIG. 12, if it is assumed that the thickness (the dimension in the X axis direction) of a control plate 80 is denoted by T, and the spread angle of a vapor deposition particle flow 92 passing through a control space 81, which is defined by the relative position between a vapor deposition source opening 61 (here, for the sake of simplification, the vapor deposition source opening 61 is regarded as a point that does not have a certain range) and the upper edge of the control plate 80, is denoted by θ, then, distance H1 from the upper edge of the control plate 80 to the position (the line A1-A1) at which vapor deposition particle flows 92 that have respectively passed through neighboring control spaces 81 partially start overlapping with each other is determined by $H1=T/(2\times\tan\theta)$.

As can be clearly seen from this, the distance H1 decreases as the thickness T of the control plate 80 decreases, and the position at which the vapor deposition particle flows 92 start overlapping with each other is in the proximity of the control plate 80. In the case where, for example, the spread angle θ is 5° and the thickness T of the control plate 80 is 0.5 mm, $H1=0.5/(2\times\tan 5°)=2.9$ mm is obtained, and in a region located not less than 2.9 mm above the upper edge of the control plate 80, the vapor deposition particle flows 92 at least partially overlap with each other.

A number within parentheses shown in FIG. 12 indicates the degree of overlap of vapor deposition particle flows 92 in the region in which the number is written (or in other words, the number of overlapping vapor deposition particle flows 92). In a region whose degree of overlap is 1 and in which "(1)" is written, there is only a single vapor deposition particle flow 92 that has passed through a single control space 81. In a region whose degree of overlap is 2 and in which "(2)" is written, two vapor deposition particle flows 92 that have respectively passed through two neighboring control spaces 81 that are adjacent in the X axis direction overlap with each other. In a region whose degree of overlap is 3 and in which "(3)" is written, three vapor deposition particle flows 92 that have respectively passed through three control spaces 81 located successively in the X axis direction overlap with each other. The same applies to regions in which "(4)" or the subsequent number is written. As it gets farther away from the line A1-A1 toward the upper side, the number of overlapping vapor deposition particle flows 92 increases.

At any position on the line A1-A1 shown in FIG. 12, the degree of overlap is 1. At any position on the line A2-A2, the degree of overlap is 2. At any position on the line A3-A3, the degree of overlap is 3. Accordingly, it is preferable to dispose the deposition surface 10e at a position at which the degree of overlap is constant in the X axis direction such as the line A1-A1, the line A2-A2, the line A3-A3 and so on because by doing so, the uniformity of the thickness of the coating film 90 is improved at any position on the deposition surface 10e. Furthermore, the number of overlapping vapor deposition particle flows 92 increases as the deposition surface 10e is disposed farther away from the control plates 80 such as the line A1-A1, the line A2-A2, the line A3-A3 and so on. Accordingly, variations in the vapor deposition particle density between vapor deposition particle flows 92 are averaged, and the uniformity of the thickness of the coating film 90 is improved.

In a region between the line A1-A1 and the line A2-A2, there are a degree of overlap of 1 and a degree of overlap of 2. In a region between the line A2-A2 and the line A3-A3, there are a degree of overlap of 2 and a degree of overlap of 3. Likewise, in a region between the line A3-A3 and the line A4-A4 (not shown), there are a degree of overlap of 3 and a degree of overlap of 4. If the distribution of the vapor deposition particles discharged from the vapor deposition source openings 61 is simplified assuming that there is no departure angle dependency, the vapor deposition particle density is proportional to the degree of overlap. Accordingly, even if it is not possible to dispose the deposition surface 10e at a position of the line A1-A1, the line A2-A2, the line A3-A3 or the like, because the change in the vapor deposition particle density in the X axis direction becomes smaller as the deposition surface 10e is disposed at a position farther away from the line A1-A1 toward the upper side, the uniformity of the thickness of the coating film 90 is improved.

Example 1 corresponding to Embodiment 1 will be shown. It should be noted, however, that the present invention is not limited to the example given below.

Figure 13:
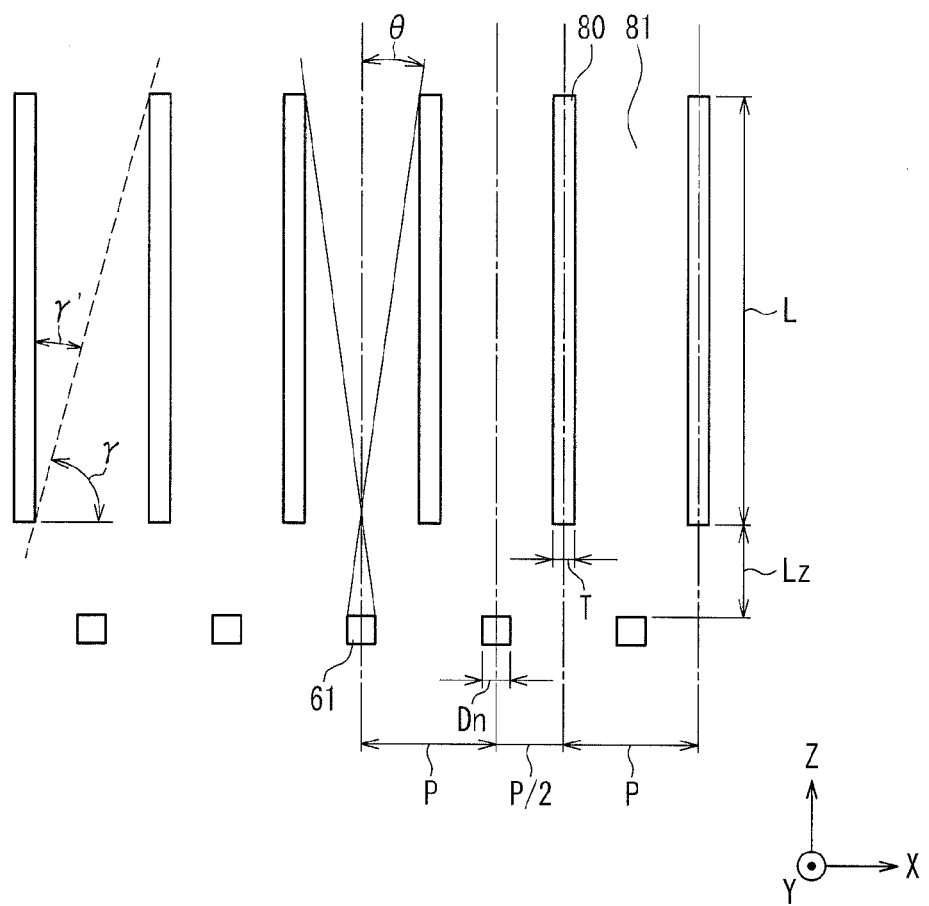
FIG. 13 is a partially enlarged front view showing an arrangement of vapor deposition source openings and control plates in Example 1 corresponding to Embodiment 1 according to the present invention.

FIG. 13 is an enlarged view showing some of the vapor deposition source openings 61 and the control plates 80.

Each control plate 80 had a length L in the Z axis direction of 50 mm, a length in the Y axis direction of 190 mm and a dimension T in the X axis direction (thickness) of 0.5 mm. SUS 304 was used as a material of the control plate 80. A plurality of the control plates 80 were integrally held by a holding member 85 (see FIGS. 9 and 10) at an arrangement pitch P in the X axis direction of 8 mm. The holding member 85 had an outer dimension in the Y axis direction of 200 mm and an outer dimension in the X axis direction of 600 mm.

As shown in FIG. 13, when viewed in the Y axis direction, if it is assumed that the angle formed between the X axis direction and a straight line connecting the lower end of the surface of one of a pair of neighboring control plates 80 that were adjacent in the X axis direction, the surface opposing the other control plate 80, and the upper end of the surface of the other control plate 80 that opposes the one control plate 80 is denoted by y, the following equation is obtained:

$$\tan \gamma = L/(P-T) = 6.7.$$

Accordingly, $\gamma = 81.5°$ is obtained. Therefore, the spread angle $\gamma'$ ($\gamma' = 90° \cdot \gamma$) of the vapor deposition particles determined by neighboring control plates 80 was therefore 8.5°. That is, the departure angle of the vapor deposition particles departing from the control space 81 was limited to 8.5° or less by the plurality of control plates 80.

The arrangement pitch P in the X axis direction of the vapor deposition source openings 61 was set to 8 mm, which was the same as the arrangement pitch P in the X axis direction of the control plates 80. Each vapor deposition source opening 61 was disposed at a center position between neighboring control plates 80 that were adjacent in the X axis direction. The opening shape of the vapor deposition source opening 61 as viewed from above along the Z axis direction was a circular shape having a diameter Dn of 4 mm. Interval Lz in the Z axis direction from the upper end of the vapor deposition source opening 61 to the lower end of the control plate 80 was set to 10 mm. The maximum departure angle Φ (see FIG. 8) of the vapor deposition particles discharged from the vapor deposition source opening 61 was set to approximately 60°.

The vapor deposition particles discharged over a certain range from a vapor deposition source opening 61 entered a control space 81 directly above the vapor deposition source opening 61 as well as control spaces 81 located on both sides of the control space 81. However, in the present example, among the vapor deposition particles discharged from the vapor deposition source opening 61, those that have entered the control spaces 81 other than the control space 81 located directly above the vapor deposition source opening 61 collided with and were captured by the control plates 80 and therefore could not pass through the control spaces 81. A condition for achieving this is as follows:

$$\tan \gamma \geq 2Lz/(P-Dn+T) \quad (1\text{-}1).$$

In the present embodiment, the right side of the above inequality is 4.4, and thus the above inequality was satisfied.

The spread angle θ of the vapor deposition particles that have passed through the control space 81 shown in FIG. 13 is represented by:

$$\cot \theta = 2(L+Lz)/(P+Dn-T) \quad (1\text{-}2).$$

In the present embodiment, from Equation (1-2) given above, $\theta = 5.5°$ was obtained and $\theta < \gamma'$ was satisfied. Accordingly, in the present embodiment, the greatest incidence angle of the vapor deposition particles entering each mask opening 71 of the vapor deposition mask 70 (maximum incidence angle) was dependent on the spread angle θ and found to be 5.5°. Here, the maximum incidence angle of the vapor deposition particles entering the mask opening 71 is defined by the angle formed between the flight direction of the vapor deposition particles entering the mask opening 71 and the normal line of the vapor deposition mask 70 (or in other words, the Z axis direction) as viewed in a direction parallel to the Y axis direction.

The vapor deposition mask 70 had a dimension in the X axis direction of 600 mm, a dimension in the Y axis direction of 200 mm and a dimension in the Z axis direction (thickness Tm) of 50 μm. An invar material (an alloy containing Fe and 36% of Ni) was used as a material for the vapor deposition mask 70.

The vapor deposition mask 70 had 751 mask openings 71 that were formed in the X axis direction at a pitch in the X axis direction of 450 μm, each mask opening 71 having a slot shape and a dimension in the Y axis direction of 150 mm and a dimension Wm in the X axis direction of 90 μm. At this time, the aspect ratio cots of the mask opening 971 (see FIG. 8) was 1.7. In the present embodiment, δ>θ, and thus the maximum incidence angle a of the vapor deposition particles with respect to the substrate 10 was dependent on the spread angle θ.

Around the region of the vapor deposition mask 70 in which a plurality of mask openings 71 were formed, a shielding plate made of invar material was installed so as to prevent the vapor deposition particles from adhering to the deposition surface 10e of the substrate 10, without passing through the control spaces 81 and the mask openings 71.

The distance between the upper end of the control plates 80 and the deposition surface 10e of the substrate 10 was set to 70 mm, and the interval H between the vapor deposition mask 70 and the deposition surface 10e of the substrate 10 was set to 300 μm.

Pixels (the pixels referring to the sub-pixels 2R, 2G and 2B shown in FIG. 2) were each configured to have a size (the actual size of the light-emitting region) of 300 μm in the Y axis direction and 70 μm in the X axis direction. The pixel pitch in the Y axis direction was set to 450 μm and the pixel pitch in the X axis direction was set to 150 μm.

The vapor deposition rates of host material and guest material (dopant material) were set to 5.0 nm/s and 0.53 nm/s for red (R), 5.0 nm/s and 0.67 nm/s for green (G), and 5.0 nm/s and 0.67 nm/s for blue (B).

With the configuration as described above, the substrate 10 was subjected to a single round trip scanning in the Y axis direction so as to form a vapor deposition film that was made of an organic material and had the desired pixel pattern, whereby a light emitting layer was formed. That is, among the vapor deposition particles discharged from each vapor deposition source opening 61, only those that have passed through a control space 81 located directly above the vapor deposition source opening 61 and the mask openings 71 adhered to the deposition surface 10e of the substrate 10.

In the present embodiment, the maximum incidence angle α of the vapor deposition particles with respect to the substrate 10 was 5.5°, which was the same as the spread angle θ of the vapor deposition particles that have passed through the control space 81. Accordingly, the width We (see FIG. 7) of a blur portion of the coating film was as follows:

$$We = H \times \tan \alpha = 29 \text{ μm}.$$

The width We of the blur portion was smaller than the dimension in the X axis direction of a non-light-emitting region between neighboring light-emitting regions that were adjacent in the X axis direction. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

As can be understood from the above example, according to the present embodiment, the major surface of the control plates 80 is parallel to the scanning direction of the substrate 10, or in other words, the Y axis direction, and thus the control plates 80 do not have a function of limiting the spread angle of the vapor deposition particles in the Y axis direction (within the YZ plane). That is, even the vapor deposition particles having a large speed vector component in the Y axis direction do not collide with and are not captured by the control plates 80. Accordingly, reduction in the material utilization efficiency due to provision of the control plates 80 is small. Conversely, the vapor deposition beam direction adjustment plate of Patent Document 4 in which vapor deposition beam-pass-through holes are formed limits the spread angle of the vapor deposition particles in all directions orthogonal to the normal line of the substrate 10, and thus the material utilization efficiency decreases significantly. In the present embodiment, in the case where the spread angle in the Y axis direction of the vapor deposition particles discharged from a vapor deposition source opening 61 is so large that the vapor deposition particles fly in unwanted directions, shielding plates or the like for limiting the spread angle in the Y axis direction of the vapor deposition particles may be installed.

In Example 1 given above, each vapor deposition source opening 61 is arranged in the center between neighboring control plates 80 that are adjacent in the X axis direction. Accordingly, a control space 81 is located in a region that is directly above the vapor deposition source opening 61 and that has the highest vapor deposition particle density. This configuration can reduce the vapor deposition particles that collide with and are captured by the control plates 80, and thus it is advantageous from the viewpoint of preventing reduction in the material utilization efficiency and the vapor deposition rate.

In Example 1 given above, it is only necessary to dispose the control plates 80 that have the same dimensions in parallel, and it is sufficient that the dimensional accuracy and assembly accuracy of the control plates 80 are the order of 100 μm. Accordingly, it is unnecessary to perform special and highly accurate processing on the plurality of control plates 80.

In Example 1 given above, the vapor deposition particles that adhere to the substrate 10 are those that have passed through a single control space 81 that is located directly above a vapor deposition source opening 61. This configuration can shorten the length L of the control plates 80 as compared to other embodiments, which will be described below. That is, Equation (1-1) is true even when the length L of the control plates 80 has a small value. Accordingly, the distance from the vapor deposition source openings 61 to the substrate 10 can be reduced, which is advantageous in improvement of the vapor deposition rate and reduction of the device size.

Also, in Example 1 given above, the pitch in the X axis direction is the same between the vapor deposition source openings 61 and the control plates 80, and it is therefore possible to reduce variations in the thickness of the coating film 90 formed on the substrate 10 in the X axis direction.

Example 1 described above is merely an example and can be changed as appropriate.

For example, the dimensions (the length L and the thickness T in particular) of the control plates 80 are not limited to those described in Example 1 above and can be freely set. However, in order to satisfy the condition for causing the vapor deposition particles discharged from a vapor deposition source opening 61 to pass through only a control space 81 located directly above the vapor deposition source opening 61, it is necessary to satisfy Equation (1-1) given above. Accordingly, the dimensions of the control plates 80 can be designed arbitrarily as long as Equation (1-1) is satisfied. However, increasing the thickness T of the control plates 80 reduces the open area ratio of the control plates 80 (=(P−T)/P), causing reduction of material utilization efficiency. Accordingly, the thickness T of the control plates 80 is preferably set so as to be as small as possible.

In Example 1 given above, a vapor deposition source opening 61 is arranged in the center between neighboring control plates 80 in the X axis direction, but the present invention is not limited thereto, and the vapor deposition source opening 61 can be arranged at any position between neighboring control plates 80. In this case, "P" in Equations (1-1) and (1-2) given above can be replaced as follows. Specifically, a case will be considered in which a vapor deposition source opening 61 is arranged at a position shifted to the right from the center between neighboring control plates 80 by a distance x in FIG. 13, which is a diagram as viewed in the Y axis direction. In this case, Equations (1-1) and (1-2) given above may be applied by replacing "P" with "P−2x" for the right side portion of a straight line parallel to the Z axis passing through the center of the vapor deposition source opening 61, and "P" with "P+2x" for the left side portion. Shifting the position in the X axis direction of a vapor deposition source opening 61 from the center between neighboring control plates 80 allows the blur portions on both sides of the coating film 90 in the X axis direction to have different widths We (see FIG. 7).

In Example 1 given above, the pitch in the X axis direction is the same between the vapor deposition source openings 61 and the control plates 80, but the present invention is not limited thereto, and they may be arranged at different pitches in the X axis direction. However, in the case where the relative positional relationship between the vapor deposition source openings 61 and the control plates 80 is not constant in the X axis direction such as when the positions in the X axis direction of the vapor deposition source openings 61 and the control plates 80 are randomly set, in the X axis direction, variations occur in the thickness of the coating film 90 formed on the substrate 10. Accordingly, it is preferable that the pitch in the X axis direction of the vapor deposition source openings 61 and the pitch in the X axis direction of the control plates 80 have a relationship in which one of them is an integer multiple of the other.

(Embodiment 2)

Embodiment 1 is configured such that the vapor deposition particles discharged from a vapor deposition source opening 61 can pass through only a single control space 81 located directly above the vapor deposition source opening 61. Embodiment 2 is configured such that the vapor deposition particles discharged from a vapor deposition source opening 61 can pass through, in addition to the single control space 81 located directly above the vapor deposition source opening 61, two control spaces 81 located on both sides of the single control space 81. In other words, the vapor deposition particles discharged from each vapor deposition source opening 61 pass through three control spaces 81 arranged successively in the X axis direction, with the control space 81 located directly above the vapor deposition source opening 61 being the middle of the three control spaces 81. A configuration is also possible in which the vapor deposition particles pass through control spaces 81 located further outward. The configuration of a vapor deposition device according to Embodiment 2 is the same as that of Embodiment 1 except for the above difference.

In the present embodiment as well, as in Embodiment 1, at least a part of the coating film 90 formed on the substrate 10 is formed by the vapor deposition particles 91 that have passed through two or more different control spaces 81. Specifically, the vapor deposition particles 91 that have passed through a plurality of control spaces 81 at different positions in the X axis direction adhere to the same place on the deposition surface 10e of the substrate 10.

Figure 14:
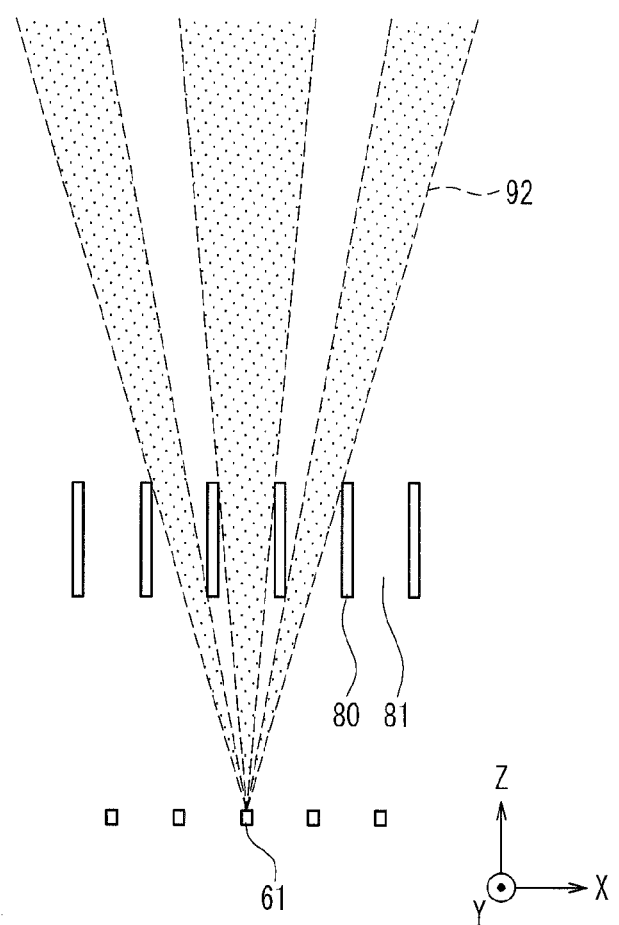
FIG. 14 is a diagram showing vapor deposition particle flows passing through inter-control plate spaces in Embodiment 2 of the present invention.

FIG. 14 is a diagram of vapor deposition particle flows 92 of the vapor deposition particles discharged from a vapor deposition source opening 61 and passing through three control spaces 81 in total including a control space 81 directly above the vapor deposition source opening 61 and control spaces 81 located on both sides of the control space 81 according to the present embodiment, shown in the same manner as in FIG. 12. In order to simplify the illustration in FIG. 14, only vapor deposition particle flows 92 discharged from a single vapor deposition source opening 61 are shown. Although a detailed description is not given here, similarly as described in FIG. 12, in FIG. 14 as well, in the upper side region from the position above the upper edge of the control plates 80 by a predetermined distance, two or more vapor deposition particle flows 92 at least partially overlap with each other. The deposition surface 10e of the substrate 10 is installed in this region. Similarly as described in FIG. 12, in the present embodiment as well, it is preferable to dispose the deposition surface 10e at a position at which the degree of overlap is constant in the X axis direction or a position as far as possible from the control plates 80 because the uniformity of the thickness of the coating film 90 is improved.

The same applies to the case where the vapor deposition particles discharged from a vapor deposition source opening 61 pass through more control spaces 81.

Example 2 corresponding to Embodiment 2 will be shown. It should be noted, however, that the present invention is not limited to the example given below.

Figure 15:
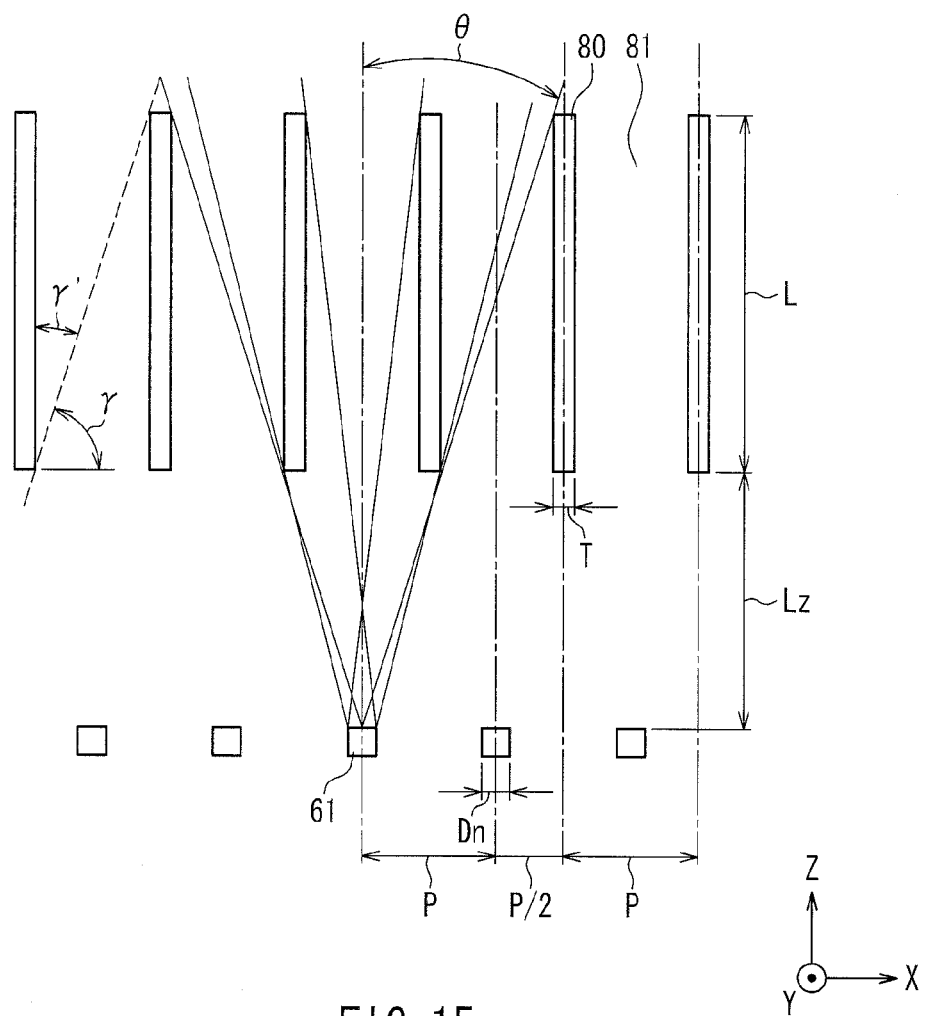
FIG. 15 is a partially enlarged front view showing an arrangement of vapor deposition source openings and control plates in Example 2 corresponding to Embodiment 2 according to the present invention.

FIG. 15 is an enlarged view showing some of the vapor deposition source openings 61 and the control plates 80. Example 2 is different from Example 1 (FIG. 13) of Embodiment 1 in that the vapor deposition particles discharged from a single vapor deposition source opening 61 pass through not only a control space 81 directly above the vapor deposition source opening 61, but also two control spaces 81 that are adjacent to the control space 81. In Example 2, the vapor deposition particles discharged from a vapor deposition source opening 61 cannot pass through any control spaces located farther than control spaces 81 that are adjacent to the control space 81 directly above the vapor deposition source opening 61. The configuration of Example 2 other than the above was the same as that of Example 1, except for the dimensions and arrangement of the control plates 80. The structure of the vapor deposition device, the process for forming an organic vapor deposition film pattern and the like were also the same as those of Example 1.

The dimensions, the pitch P in the X axis direction, the material and the like of the control plates 80 were set to be the same as those of Example 1, except that the length L in the Z axis direction of each control plate 80 was changed to 75 mm.

As shown in FIG. 15, when viewed in the Y axis direction, if it is assumed that the angle formed between the X axis direction and a straight line connecting the lower end of the surface of one of a pair of neighboring control plates 80 that were adjacent in the X axis direction, the surface opposing the other control plate 80, and the upper end of the surface of the other control plate 80 that opposes the one control plate 80 is denoted by γ, the following equation is obtained:

$$\tan \gamma = L/(P-T) = 10.$$

Accordingly, $\gamma = 84.3°$ is obtained. The spread angle $\gamma'$ ($\gamma' = 90° - \gamma$) of the vapor deposition particles determined by neighboring control plates 80 was therefore 5.7°. That is, the departure angle of the vapor deposition particles departing from the control space 81 was limited to 5.7° or less by the plurality of control plates 80.

The pitch P in the X axis direction, the opening shape and the opening diameter Dn of the vapor deposition source openings 61 and the maximum departure angle Φ (see FIG. 8) of the vapor deposition particles were set to be the same as those of Example 1. As in Example 1, each vapor deposition source opening 61 was disposed at a center position between neighboring control plates 80 that were adjacent in the X axis direction. The interval Lz in the Z axis direction between the upper end of the vapor deposition source opening 61 and the lower end of the control plates 80 was set to 30 mm.

The vapor deposition particles discharged over a certain range from a vapor deposition source opening 61 entered, in addition to a control space 81 directly above the vapor deposition source opening 61, a plurality of control spaces 81 located in the periphery of the control space 81. However, in the present embodiment, among the vapor deposition particles discharged from a vapor deposition source opening 61, those that have entered control spaces 81 other than the control space 81 located directly above the vapor deposition source opening 61 and control spaces 81 located on both sides of the control space 81 collided with and were captured by the control plates 80 and thus could not pass therethrough. A condition for achieving this is as follows:

$$2Lz/(P-Dn+T) > \tan \gamma \geq 2Lz/(3P-Dn+T) \quad (2\text{-}1).$$

In the present embodiment, the leftmost side of the inequality is 13.3 and the rightmost side is 2.9, and therefore the inequality was satisfied.

The spread angle θ of the vapor deposition particles that have passed through the control spaces 81 shown in FIG. 15 varies depending on whether the following inequality is true or false:

$$2Lz/(P+Dn+T) > L/(P-T) \quad (2\text{-}2).$$

If Inequality (2-2) is true, then, $$\cot \theta = 2 \times (L+Lz)/(3P+Dn-T) \quad (2\text{-}3).$$

If Inequality (2-2) is false, then, $$\cot \theta = L/(P-T) \quad (2\text{-}4).$$

In the present embodiment, the left side of Inequality (2-2) was 4.8, and the right side was 10. Accordingly, Inequality (2-2) was found to be false, and from Equation (2-4), θ=5.7° was obtained, and then θ=γ' was satisfied. Therefore, in the present example, the greatest incidence angle (maximum incidence angle) of the vapor deposition particles entering each mask opening 71 of the vapor deposition mask 70 was dependent on the spread angle γ' and the spread angle θ, and found to be 5.7°.

The configuration of the vapor deposition mask 70 was set to be the same as that of Example 1. The aspect ratio cot δ (see FIG. 8) of the mask openings 71 was set to be approximately 1.7, which was the same as that of Example 1. Because δ>θ was satisfied, the maximum incidence angle α of the vapor deposition particles with respect to the substrate 10 was dependent on the spread angle γ' and the spread angle θ.

The distance from the upper end of the control plates 80 to the deposition surface 10e of the substrate 10 was set to 125 mm. The interval H between the vapor deposition mask 70 and the deposition surface 10e of the substrate 10 was set to be the same as that of Example 1.

The pixel pattern and the vapor deposition rate were set to be the same as those of Example 1.

With the configuration as described above, the substrate 10 was subjected to a single round trip scanning in the Y axis direction so as to form a vapor deposition film that was made of an organic material and had the desired pixel pattern, whereby a light emitting layer was formed. That is, among the vapor deposition particles discharged from a vapor deposition source opening 61, those that have passed through a control space 81 located directly above the vapor deposition source opening 61 and control spaces 81 located on both sides of the control space 81 and then through the mask openings 71 adhered to the deposition surface 10e of the substrate 10.

In the present example, the maximum incidence angle α of the vapor deposition particles with respect to the substrate 10 was 5.7°, which was the same as the spread angle γ' and the spread angle θ. Accordingly, the width We (see FIG. 7) of a blur portion of the coating film was as follows:

$$We = H \times \tan \alpha = 30 \text{ μm}.$$

The width We of the blur portion was smaller than the dimension in the X axis direction of a non-light-emitting region between neighboring light-emitting regions that were adjacent in the X axis direction. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

The vapor deposition particles discharged from a single vapor deposition source opening 61 and contributing to formation of the coating film 90 pass through only a single control space 81 in Embodiment 1, whereas in Embodiment 2, the vapor deposition particles pass through a plurality of control spaces 81 (three control spaces 81 in Embodiment 2) in a split manner. That is, as compared to Embodiment 1, in the present embodiment, more vapor deposition particle flows are formed by the control plates 80 splitting the vapor deposition particles into smaller groups, whereby more vapor deposition particle flows overlap with each other on the substrate 10, forming the coating film 90. Accordingly, variations and the like in the vapor deposition particle density between vapor deposition particle flows 92 are averaged, and the uniformity of the thickness of the coating film 90 is improved.

In the case where the spread angle θ follows Equation (2-4), the spread angle θ is not dependent on the opening diameter Dn of the vapor deposition source openings 61 and the interval Lz in the Z axis direction between the upper end of the vapor deposition source openings 61 to the lower end of the control plates 80. Accordingly, the width We of the blur portion is not affected by the accuracy of the opening diameter Dn or the interval Lz, and thus the width We of the blur portion can be controlled with high accuracy, with less variations than in Embodiment 1.

Embodiment 2 is the same as Embodiment 1 except for the above difference, and thus can produce the effects similar to those described in Embodiment 1.

Embodiment 2 described above is merely an example and can be changed as appropriate.

For example, the dimensions (the length L and the thickness T in particular) of the control plates 80 are not limited to those described in Example 2 above and can be freely set. However, in order to satisfy the condition for causing the vapor deposition particles discharged from a vapor deposition source opening 61 to pass through only a control space 81 located directly above the vapor deposition source opening 61 and control spaces 81 on both sides of the control space 81, it is necessary to satisfy Equation (2-1) given above. Accordingly, the dimensions of the control plates 80 can be designed arbitrarily as long as Equation (2-1) is satisfied. Increasing the thickness T of the control plates 80 reduces the open area ratio of the control plates 80, and thus the thickness T of the control plates 80 is preferably set so as to be as small as possible, which is the same as in Embodiment 1.

In Example 2 given above, the vapor deposition particles discharged from a vapor deposition source opening 61 pass through only three control spaces 81 in total including a control space 81 located directly above the vapor deposition source opening 61 and control spaces 81 located on both sides of the control space 81, but the present invention is not limited thereto, and the vapor deposition particles may pass through more control spaces 81. In this case, the rightmost side of Inequality (2-1) given above needs to be changed as appropriate. For example, in the case where the vapor deposition particles discharged from a vapor deposition source opening 61 pass through, in addition to the control space 81 located directly above the vapor deposition source opening 61, two control spaces 81 located on each side of the control space 81 (or in other words, five successive control spaces 81), "3P" in Inequality (2-1) given above can be replaced with "5P". Generally, in the case where the vapor deposition particles discharged from a vapor deposition source opening 61 pass through a control space 81 located directly above the vapor deposition source opening 61 and n control spaces 81 adjacent on each side of the control space 81 (where n is a natural number), or in other words, a total of (2n+1) control spaces 81, "3P" in Inequality (2-1) can be replaced with "(2n+1)P". Furthermore, "P" on the left side of Equation (2-2) and "3P" of Equation (2-3) can be replaced with "(2n−1)P" and "(2n+1)P", respectively.

Figure 16:
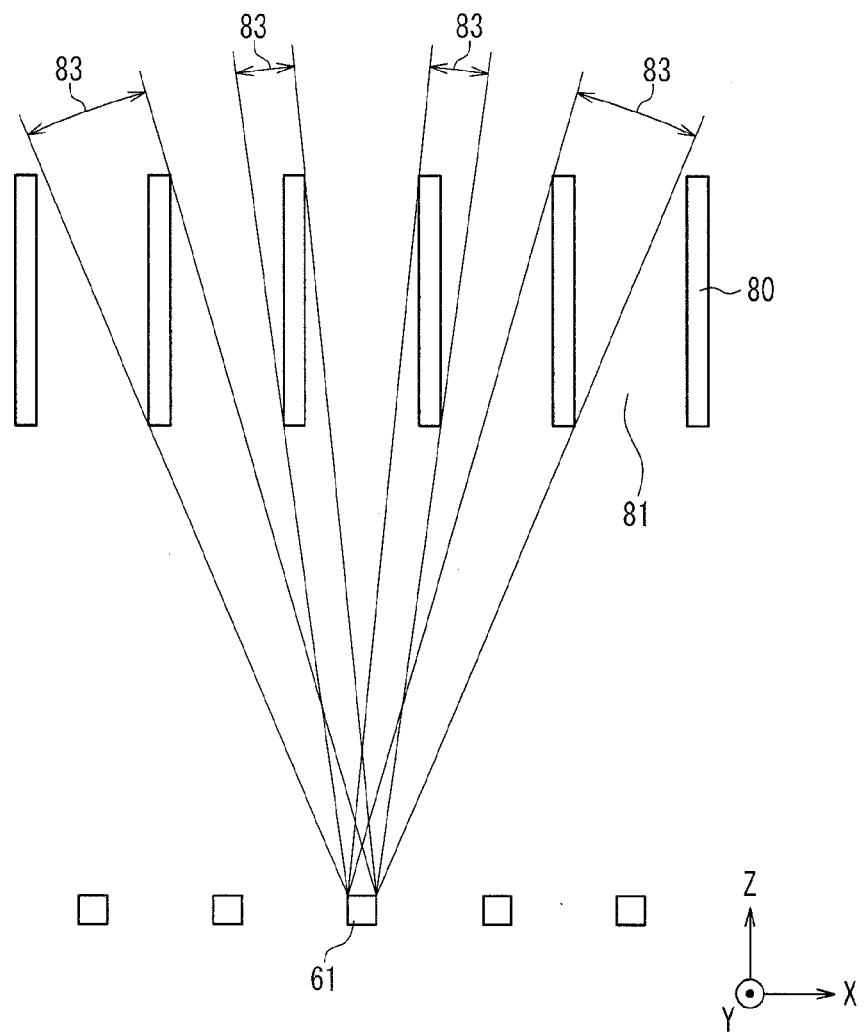
FIG. 16 is a partially enlarged front view showing another arrangement of vapor deposition source openings and control plates in Embodiment 2 according to the present invention.

However, if "n" is too large, as can be understood from FIG. 16, the number of angular regions 83, shielded by the control plates 80 as viewed from the vapor deposition source opening 61, increases, and thus the vapor deposition rate and the material utilization efficiency decrease. Accordingly, in view of this problem, "n" is preferably small, and most preferably n=1 as shown in Example 2 above.

In Example 2 given above, a vapor deposition source opening 61 is arranged in the center between neighboring control plates 80 that are adjacent in the X axis direction, but the present invention is not limited thereto, and the vapor deposition source opening 61 can be arranged at any position between neighboring control plates 80. In this case, "P" and "3P" in Equations (2-1) to (2-4) given above can be replaced as follows. Specifically, a case will be considered in which a vapor deposition source opening 61 is arranged at a position shifted to the right from the center between neighboring control plates 80 by a distance x in FIG. 15, which is a diagram as viewed in the Y axis direction. In this case, Equations (2-1) to (2-4) may be applied by replacing "P" with "P−2x" and "3P" with "3P−2x" for the right side portion of a straight line parallel to the Z axis passing through the center of the vapor deposition source opening 61, and replacing "P" with "P+2x" and "3P" with "3P+2x" for the left side portion. Shifting the position in the X axis direction of a vapor deposition source opening 61 from the center between neighboring control plates 80 allows the blur portions on both sides of the coating film 90 in the X axis direction to have different widths We (see FIG. 7).

In Example 2 given above, the pitch in the X axis direction is the same between the vapor deposition source openings 61 and the control plates 80, but the present invention is not limited thereto, and they may be arranged at different pitches in the X axis direction. However, similarly as described in Embodiment 1, it is preferable that the pitch in the X axis direction of the vapor deposition source openings 61 and the pitch in the X axis direction of the control plates 80 have a relationship in which one of them is an integer multiple of the other.

(Embodiment 3)

Embodiment 3 is different from Embodiments 1 and 2 in which a vapor deposition source opening 61 is present directly below a control space 81, in that a vapor deposition source opening 61 is present directly below a control plate 80. Accordingly, in Embodiment 3, the vapor deposition particles discharged from each vapor deposition source opening 61 pass through two control spaces 81 located on both sides of the control plate 80 directly above the vapor deposition source opening 61. A configuration is also possible in which the vapor deposition particles pass through control spaces 81 located further outward. The configuration of a vapor deposition device according to Embodiment 3 is the same as that of Embodiments 1 and 2 except for the above difference.

In the present embodiment as well, as in Embodiments 1 and 2, at least a part of the coating film 90 formed on the substrate 10 is formed by the vapor deposition particles 91 that have passed through two or more different control spaces 81. Specifically, the vapor deposition particles 91 that have passed through a plurality of control spaces 81 at different positions in the X axis direction adhere to the same place on the deposition surface 10e of the substrate 10.

Figure 17:
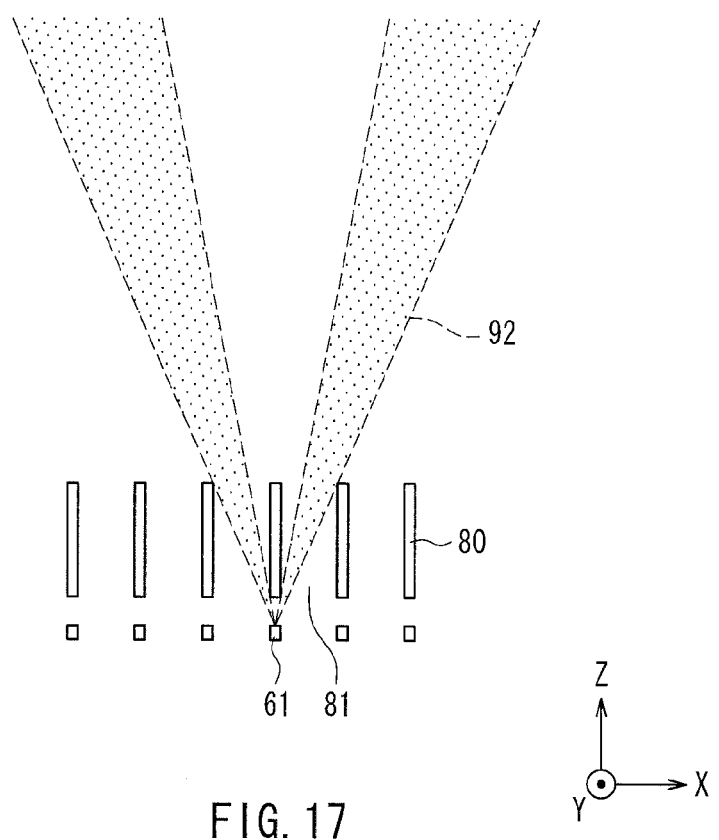
FIG. 17 is a diagram showing vapor deposition particle flows passing through inter-control plate spaces in Embodiment 3 of the present invention.

FIG. 17 is a diagram of vapor deposition particle flows 92 of the vapor deposition particles discharged from a vapor deposition source opening 61 and passing through two control spaces 81 on both sides of the control plate 80 directly above the vapor deposition source opening 61 according to the present embodiment, shown in the same manner as in FIGS. 12 and 14. In order to simplify the illustration in FIG. 17, only vapor deposition particle flows 92 discharged from a single vapor deposition source opening 61 are shown. Although a detailed description is not given here, similarly as described in FIG. 12, in FIG. 17 as well, in the upper side region from the position above the upper edge of the control plates 80 by a predetermined distance, two or more vapor deposition particle flows 92 at least partially overlap with each other. The deposition surface 10e of the substrate 10 is installed in this region. Similarly as described in FIG. 12, in the present embodiment as well, it is preferable to dispose the deposition surface 10e at a position at which the degree of overlap is constant in the X axis direction or a position as far as possible from the control plates 80 because the uniformity of the thickness of the coating film 90 is improved.

The same applies to the case where the vapor deposition particles discharged from a vapor deposition source opening 61 pass through more control spaces 81.

Example 3 corresponding to Embodiment 3 will be shown. It should be noted, however, that the present invention is not limited to the example given below.

Figure 18:
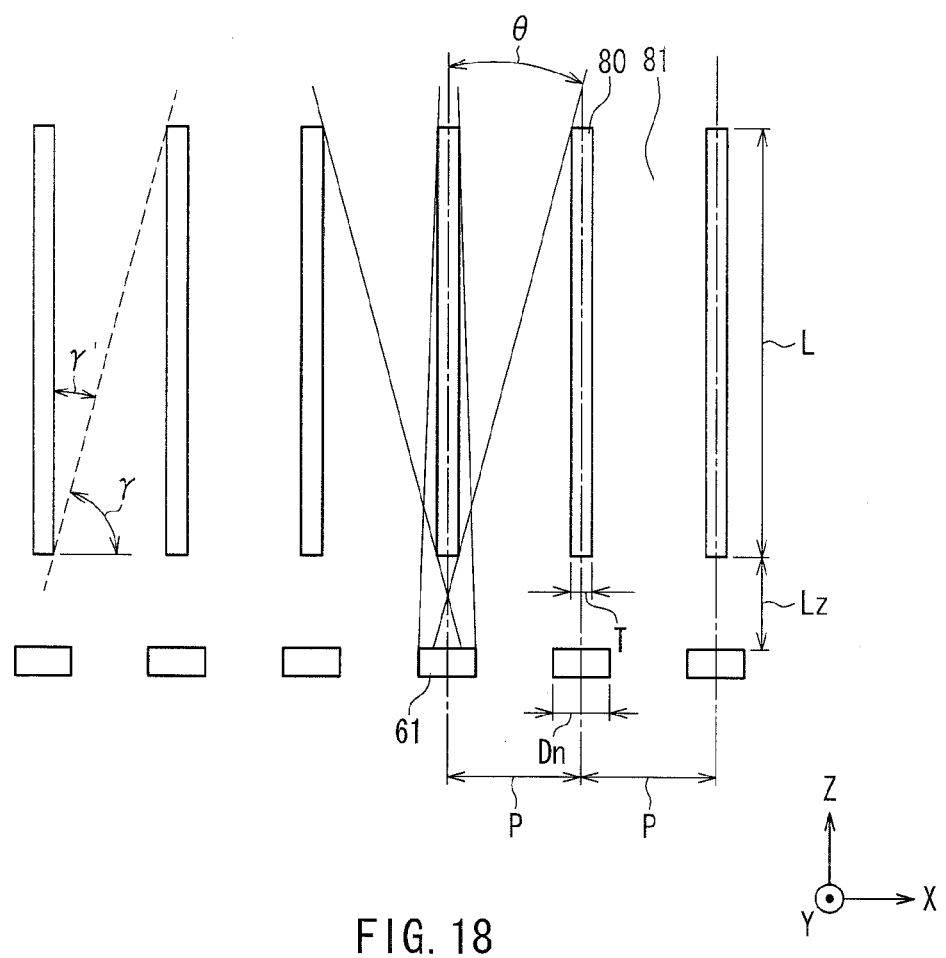
FIG. 18 is a partially enlarged front view showing an arrangement of vapor deposition source openings and control plates in Example 3 corresponding to Embodiment 3 according to the present invention.

FIG. 18 is an enlarged view showing some of the vapor deposition source openings 61 and some of the control plates 80. Example 3 is different from Example 1 (FIG. 13) of Embodiment 1 and Example 2 (FIG. 15) of Embodiment 2 in that the vapor deposition particles discharged from a single vapor deposition source opening 61 pass through two control spaces 81 on both sides of a control plate 80 located directly above the vapor deposition source opening 61. In Example 3, the vapor deposition particles discharged from a vapor deposition source opening 61 cannot pass through control spaces 81 located further outward from the two control spaces 81 sandwiching the control plate 80 located directly above the vapor deposition source opening 61. The configuration of Example 3 other than the above is the same as that of Example 1, except for the dimensions and arrangement of the control plates 80. The structure of the vapor deposition device, the process for forming an organic vapor deposition film pattern and the like are also the same as those of Example 1.

The dimensions, the pitch P in the X axis direction, the material and the like of the control plates 80 were set to be the same as those of Example 1, except that the length L in the Z axis direction of each control plate 80 was changed to 75 mm.

As shown in FIG. 18, when viewed in the Y axis direction, if it is assumed that the angle formed between the X axis direction and a straight line connecting the lower end of the surface of one of a pair of neighboring control plates 80 that were adjacent in the X axis direction, the surface opposing the other control plate 80, and the upper end of the surface of the other control plate 80 that opposes the one control plate 80 is denoted by γ, the following equation is obtained:

$\tan \gamma = L/(P-T) = 10$.

Accordingly, γ=84.3° is obtained. The spread angle γ' (γ'=90°−γ) of the vapor deposition particles determined by neighboring control plates 80 was therefore 5.7°. That is, the departure angle of the vapor deposition particles departing from the control space 81 was limited to 5.7° or less by the plurality of control plates 80.

The pitch P in the X axis direction, the opening shape and the opening diameter Dn of the vapor deposition source openings 61 and the maximum departure angle Φ (see FIG. 8) of the vapor deposition particles were set to be the same as those of Example 1. Unlike Example 1, the position in the X axis direction was the same between the vapor deposition source openings 61 and the control plates 80. The interval Lz in the Z axis direction from the upper end of the vapor deposition source openings 61 to the lower end of the control plates 80 was set to 20 mm.

The vapor deposition particles discharged over a certain range from a vapor deposition source opening 61 entered a plurality of control spaces 81 on both sides of a control plate 80 located directly above the vapor deposition source opening 61. However, in the present example, among the vapor deposition particles discharged from a vapor deposition source opening 61, those that have entered control spaces 81 other than the two control spaces 81 on both sides of the control plate 80 directly above the vapor deposition source opening 61 collided with and were captured by the control plates 80 and thus could not pass therethrough. A condition for achieving this is as follows:

$$\tan \gamma \geq 2Lz/(2P-Dn+T) \quad (3\text{-}1).$$

In the present example, the right side of the above inequality is 4.8, and therefore the inequality was satisfied.

The spread angle θ of the vapor deposition particles that have passed through the control spaces 81 shown in FIG. 18 varies depending on whether the following inequality is true or false:

$$2Lz/(Dn+T) > L(P-T) \quad (3\text{-}2).$$

If Inequality (3-2) is true, then, $$\cot \theta = 2 \times (L+Lz)/(2P+Dn-T) \quad (3\text{-}3).$$

If Inequality (3-2) is false, then, $$\cot \theta = L/(P-T) \quad (3\text{-}4).$$

In the present example, the left side of Inequality (3-2) was 8.9, and the right side was 10. Accordingly, Inequality (3-2) was found to be false, and from Equation (3-4), θ=5.7° was obtained, and then θ=γ' was satisfied. Therefore, in the present example, the greatest incidence angle (maximum incidence angle) of the vapor deposition particles entering each mask opening 71 of the vapor deposition mask 70 was dependent on the spread angle γ' and the spread angle θ, and found to be 5.7°.

The configuration of the vapor deposition mask 70 was set to be the same as that of Example 1. The aspect ratio cot δ (see FIG. 8) of the mask openings 71 was set to be approximately 1.7, which was the same as that of Example 1. Because δ>θ was satisfied, the maximum incidence angle α of the vapor deposition particles with respect to the substrate 10 was dependent on the spread angle γ' and the spread angle θ.

The distance from the upper end of the control plates 80 to the deposition surface 10e of the substrate 10 was set to 165 mm. The interval H between the vapor deposition mask 70 and the deposition surface 10e of the substrate 10 was set to be the same as that of Example 1.

The pixel pattern and the vapor deposition rate were set to be the same as those of Example 1.

With the configuration as described above, the substrate 10 was subjected to a single round trip scanning in the Y axis direction so as to form a vapor deposition film that was made of an organic material and had the desired pixel pattern, whereby a light emitting layer was formed. That is, among the vapor deposition particles discharged from a vapor deposition source opening 61, only those that have passed through two control spaces 81 located on both sides of a control plate 80 located directly above the vapor deposition source opening 61 and then through the mask openings 71 adhered to the deposition surface 10e of the substrate 10.

In the present example, the maximum incidence angle α of the vapor deposition particles with respect to the substrate 10 was 5.7°, which was the same as the spread angle γ' and the spread angle θ. Accordingly, the width We (see FIG. 7) of a blur portion of the coating film was as follows:

$$We = H \times \tan \alpha = 30 \ \mu m.$$

The width We of the blur portion was smaller than the dimension in the X axis direction of a non-light-emitting region between neighboring light-emitting regions that were adjacent in the X axis direction. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

The vapor deposition particles discharged from a single vapor deposition source opening 61 and contributing to formation of the coating film 90 pass through only a single control space 81 in Embodiment 1, whereas in Embodiment 3, the vapor deposition particles pass through a plurality of control spaces 81 (two control spaces 81 in Embodiment 2) in a split manner. That is, as compared to Embodiment 1, in the present embodiment, more vapor deposition particle flows are formed by the control plates 80 splitting the vapor deposition particles into smaller groups, whereby more vapor deposition particle flows overlap with each other on the substrate 10, forming the coating film 90. Accordingly, variations in the vapor deposition particle density between vapor deposition particle flows 92 are averaged, and the uniformity of the thickness of the coating film 90 is improved.

Although a control plate 80 is present directly above a vapor deposition source opening 61, by setting the thickness T to be small, the amount of vapor deposition particles shielded by the control plate 80 can be reduced as compared to that of Embodiment 2. Accordingly, the material utilization efficiency can be enhanced as compared to that of Embodiment 2.

In the present embodiment, it is preferable that the opening diameter Dn of the vapor deposition source opening 61 is greater than the thickness T of the control plate 80. By doing so, as can be understood from FIG. 18, the vapor deposition particles discharged from a vapor deposition source opening 61 located directly below the control plate 80 fly out and arrive even at a region directly above the control plate 80, and therefore the nonuniformity of the thickness of the coating film 90 can be improved.

In the case where the spread angle θ follows Equation (3-4), the spread angle θ is not dependent on the opening diameter Dn of the vapor deposition source openings 61 and the interval Lz in the Z axis direction between the upper end of the vapor deposition source openings 61 to the lower end of the control plates 80. Accordingly, the width We of the blur portion is not affected by the accuracy of the opening diameter Dn or the interval Lz, and thus the width We of the blur portion can be controlled with higher accuracy than in Embodiment 1.

Embodiment 3 is the same as Embodiment 1 except for the above difference, and thus can produce the effects similar to those described in Embodiment 1.

Embodiment 3 described above is merely an example and can be changed as appropriate.

For example, the dimensions (the length L and the thickness T in particular) of the control plates 80 are not limited to those described in Example 3 above and can be freely set.

However, in order to satisfy the condition for causing the vapor deposition particles discharged from a vapor deposition source opening 61 to pass through only two control spaces 81 located on both sides of the control plate 80 directly above the vapor deposition source opening 61, it is necessary to satisfy Equation (3-1). Accordingly, the dimensions of the control plates 80 can be designed arbitrarily as long as Equation (3-1) is satisfied. In the present embodiment, the control plate 80 is installed in a direction directly above the vapor deposition source opening 61 in which the largest number of vapor deposition particles fly, and therefore increasing the thickness T of the control plate 80 increases the amount of vapor deposition particles that are prevented from flying by the control plate 80. Accordingly, the thickness T of the control plates 80 is preferably set so as to be as small as possible.

In Example 3 described above, the vapor deposition particles discharged from a vapor deposition source opening 61 pass through only two control spaces 81 on both sides of a control plate 80 located directly above the vapor deposition source opening 61, but the present invention is not limited thereto, and the vapor deposition particles may pass through more control spaces 81. In this case, the right side of Inequality (3-1) given above needs to be changed as appropriate. For example, in the case where the vapor deposition particles discharged from a vapor deposition source opening 61 pass through, in addition to the two control spaces 81 on both sides of a control plate 80 located directly above the vapor deposition source opening 61, two control spaces 81 located on the outer sides of the two control spaces 81 (or in other words, four successive control spaces 81), "2P" in Inequality (3-1) given above can be replaced by "4P". Generally, in the case where the vapor deposition particles discharged from a vapor deposition source opening 61 pass through n control spaces 81 (2n control spaces 81 in total) adjacent on each side of the control plate 80 located directly above the vapor deposition source opening 61 (where n is a natural number), "2P" in Inequality (3-1) can be replaced with "2n×P". Furthermore, "2P" in Equation (3-3) can be replaced with "2n×P".

Figure 19:
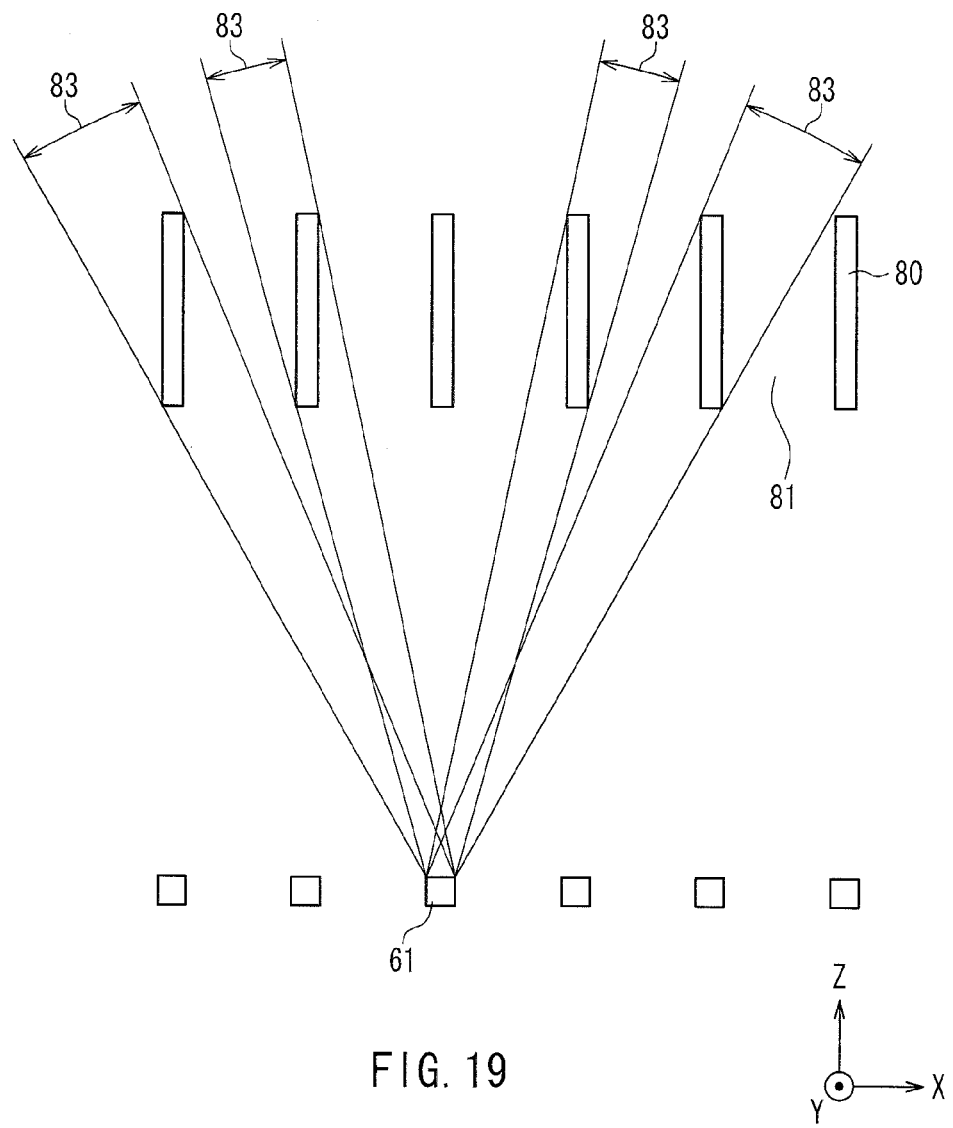
FIG. 19 is a partially enlarged front view showing another arrangement of vapor deposition source openings and control plates in Embodiment 3 according to the present invention.

However, if "n" is too large, as can be understood from FIG. 19, the number of angular regions 83, shielded by the control plates 80 as viewed from the vapor deposition source opening 61, increases, and thus the vapor deposition rate and the material utilization efficiency decrease. Accordingly, in view of this problem, "n" is preferably small, and most preferably n=1 as shown in Example 3 above.

In Embodiment 3 and Example 3 given above, a vapor deposition source opening 61 is arranged directly below a control plate 80, but the present invention is not limited thereto, and the vapor deposition source opening 61 can be arranged at a position shifted in the X axis direction from the position directly below the control plate 80. In this case, "Dn" in Equations (3-1) to (3-3) can be replaced as follows. Specifically, a case will be considered in which a vapor deposition source opening 61 is arranged at a position shifted to the right from the center in the X axis direction of a control plate 80 by a distance x in FIG. 18, which is a diagram as viewed in the Y axis direction. In this case, Equations (3-1) to (3-4) given above may be applied by replacing "Dn" in Equation (3-1) with "Dn+2x" and "Dn" in Equations (3-2) and (3-3) with "Dn−2x" for the right side portion of a straight line parallel to the Z axis passing through the center of the vapor deposition source opening 61, and replacing "Dn" in Equation (3-1) with "Dn−2x" and "Dn" in Equations (3-2) and (3-3) with "Dn+2x" for the left side portion. Shifting the position in the X axis direction of a vapor deposition source opening 61 from the position directly below the control plate 80 allows the blur portions on both sides of the coating film 90 in the X axis direction to have different widths We (see FIG. 7).

(Embodiment 4)

Figure 20:
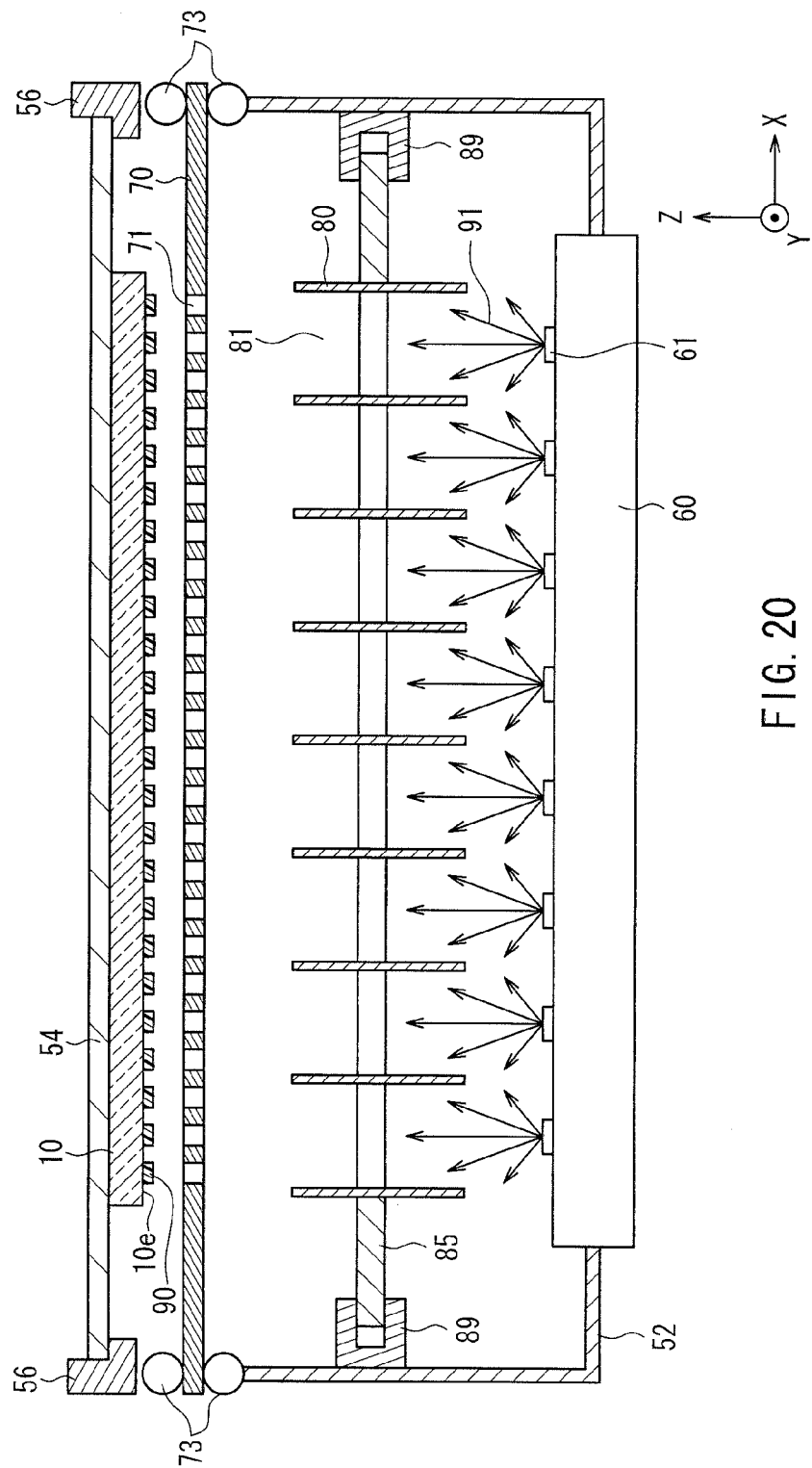
FIG. 20 is a front view of a vapor deposition device according to Embodiment 4 of the present invention as viewed in the scanning direction of a substrate.

FIG. 20 is a front view of a vapor deposition device according to Embodiment 4 of present invention as viewed in the scanning direction of a substrate. In Embodiment 4, unlike Embodiments 1 to 3, the holding body 85 that holds a plurality of control plates 80 is held by the holder 52 via a slide mechanism 89. The slide mechanism 89 causes the plurality of control plates 80 to move reciprocally in the X axis direction with respect to the vapor deposition source 60 and the vapor deposition mask 70. The configuration of the vapor deposition device according to Embodiment 4 is the same as that of Embodiments 1 to 3 except for the above difference.

Example 4 corresponding to Embodiment 4 will be shown. It should be noted, however, that the present invention is not limited to the example given below.

The dimensions of each constituent element were set to be the same as those of Example 1, except that the length L in the Z axis direction of the control plates 80 was set to 75 mm, the interval Lz in the Z axis direction between the upper end of the vapor deposition source openings 61 and the lower end of the control plates 80 was set to 30 mm, and the distance from the upper end of the control plates 80 to the deposition surface 10e of the substrate 10 was set to 100 mm.

With respect to the angle γ (see FIG. 13) defined by a pair of neighboring control plates 80 that were adjacent in the X axis direction, tan γ=10, and thus γ=84.3° was obtained. The spread angle γ' (γ'=90°−γ) of the vapor deposition particles determined by neighboring control plates 80 was therefore 5.7°. That is, the departure angle of the vapor deposition particles departing from the control space 81 was limited to 5.7° or less by the plurality of control plates 80.

As in Embodiment 1, the organic material was deposited on the deposition surface 10e of the substrate 10 while the substrate 10 was scanned in the Y axis direction at 30 mm/s. During vapor deposition, the plurality of control plates 80 were moved reciprocally in the X axis direction by the slide mechanism 89. The amount of travel of the plurality of control plates 80 by the reciprocal movement was ±3P=±24 mm (P is the arrangement pitch in the X axis direction of the vapor deposition source openings 61 and the control plates 80). Also, the average speed of travel of the plurality of control plates 80 was 180 mm/s.

In the present example, the control plates 80 were moved reciprocally in the X axis direction, and thus the relative positional relationship between the vapor deposition source openings 61 and the control plates 80 was changed with time. Accordingly, the conditions described in Embodiments 1 to 3 were met only momentarily. In the present example, the spread angle θ of the vapor deposition particles that have passed through the control space 81 is determined by the control plates 80:

$$\cot \theta \leq L/(P-T) \qquad (4\text{-}1).$$

From Equation (4-1), in the present example, the spread angle θ was 5.7° or less. Accordingly, the greatest incidence angle (maximum incidence angle) of the vapor deposition particles entering each mask opening 71 of the vapor deposition mask 70 was dependent on the spread angle θ and found to be 5.7°.

The aspect ratio cot δ (see FIG. 8) of the mask openings 71 was set to be approximately 1.7, which was the same as that of Example 1, and thus δ>θ was satisfied. Accordingly, the maximum incidence angle α of the vapor deposition particles with respect to the substrate 10 was dependent on the spread angle θ.

With the configuration as described above, the substrate 10 was subjected to a single round trip scanning in the Y axis direction while the control plates 80 were moved reciprocally in the X axis direction so as to form a vapor deposition film that was made of an organic material and had the desired pixel pattern, whereby a light emitting layer was formed. That is, the vapor deposition particles discharged from a vapor deposition source opening 61 passed through the control spaces 81 and the mask openings 71, and adhered to the deposition surface 10e of the substrate 10.

In the present example, the maximum incidence angle α of the vapor deposition particles with respect to the substrate 10 was 5.7°, which was the same as the maximum spread angle θ. Accordingly, the width We (see FIG. 7) of a blur portion of the coating film was as follows:

$$We = H \times \tan \alpha = 30 \ \mu m.$$

The width We of the blur portion was smaller than the dimension in the X axis direction of a non-light-emitting region between neighboring light-emitting regions that were adjacent in the X axis direction. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

In the present embodiment, the control plates 80 are reciprocally moved during vapor deposition, and thus variations in the vapor deposition particle density in the X axis direction, which are caused by the relative positional relationship between the control plates 80 and the vapor deposition source opening 61, are averaged. Accordingly, the uniformity of the thickness of the coating film 90 is improved.

Also, due to the reciprocal movement of the control plates 80, the control plates 80 involved in selection of vapor deposition particles that have reached a certain location on the deposition surface 10e of the substrate 10 are changed with time. Accordingly, variations in the vapor deposition particle density in the X axis direction, which are cause by variations in the dimensional accuracy and installation accuracy of each control plate 80, are averaged. Accordingly, the uniformity of the thickness of the coating film 90 is improved.

In the present embodiment, the spread angle θ follows (4-1), the spread angle θ is not dependent on the opening diameter Dn of the vapor deposition source openings 61 and the interval Lz in the Z axis direction between the upper end of the vapor deposition source openings 61 and the lower end of the control plates 80. Accordingly, the width We of the blur portion is not affected by the accuracy of the opening diameter Dn or the interval Lz, and thus the width We of the blur portion can be controlled with higher accuracy than in Embodiment 1.

The configuration described in the present embodiment that causes a plurality of control plates 80 to move reciprocally in the X axis direction during vapor deposition can be applied to any of Embodiments 1 to 3.

Embodiment 4 is the same as Embodiments 1 to 3 except for the above difference, and thus can produce the effects similar to those described in Embodiments 1 to 3.

Embodiment 4 described above is merely an example and can be changed as appropriate.

For example, in Example 4 given above, the pitch in the X axis direction is the same between the vapor deposition source openings 61 and the control plates 80, but the present invention is not limited thereto, and they may be arranged at different pitches in the X axis direction. For example, the positions in the X axis direction of the vapor deposition source openings 61 and the control plates 80 may be randomly set. Unlike Embodiments 1 to 3, nonuniformity in the X axis direction in the relative positional relationship between the vapor deposition source openings 61 and the control plates 80, which is caused by the fact that one of the pitch in the X axis direction of the vapor deposition source openings 61 and the pitch in the X axis direction of the control plates 80 is not an integer multiple of the other, is averaged by reciprocally moving the control plates 80. Accordingly, in the X axis direction, variations in the thickness of the coating film 90 formed on the substrate 10 are unlikely to occur.

In Example 4 given above, the amount of travel of the control plates 80 by the reciprocal movement is set to ±24 mm, but the present invention is not limited thereto, and it may be greater or smaller than that. However, in order to reduce variations in the thickness of the coating film 90 formed on the substrate 10, the amount of travel of the control plates 80 by the reciprocal movement is preferably greater than the greater one of the pitch in the X axis direction of the vapor deposition source openings 61 and the pitch in the X axis direction of the control plates 80, and more preferably is an integer multiple of the greater one.

In Example 4 given above, the control plates 80 are moved reciprocally in the X axis direction with respect to the vapor deposition source 60 and the vapor deposition mask 70 that are stationary, but the present invention is not limited thereto. For example, the vapor deposition source 60 may be moved reciprocally in the X axis direction while the positions of the control plates 80 and the vapor deposition mask 70 are fixed. Alternatively, the vapor deposition source 60 and the control plates 80 may be moved reciprocally in the X axis direction while the position of the vapor deposition mask 70 is fixed. In either case, by changing the relative positional relationship between the vapor deposition source openings 61 and the control plates 80 with time, the effects of the present embodiment can be obtained. Alternatively, the control plates 80 and the vapor deposition source 60 may be moved together reciprocally in the X axis direction with respect to the vapor deposition mask 70 whose position is fixed, while the relative positional relationship between the control plates 80 and the vapor deposition source 60 is fixed. In this case as well, the relative positional relationship between the vapor deposition mask 70, the control plates 80 and the vapor deposition source openings 61 is changed with time, and thus variations in the vapor deposition particle density in the X axis direction, which are caused by the relative positional relationship, are averaged. Also, because the control plates 80 and the vapor deposition source openings 61 are together moved reciprocally, the control plates 80 and the vapor deposition source openings 61 from which vapor deposition particles that reach a certain location on the deposition surface 10e of the substrate 10 are derived are changed with time. Accordingly, variations in the vapor deposition particle density in the X axis direction, which are caused by variations in the accuracy of the control plates 80 or the vapor deposition source openings 61, are averaged. Therefore, as in Example 4, the uniformity of the thickness of the coating film 90 is improved. In this case, the relative positional relationship between the control plates 80 and the vapor deposition source 60 is fixed, the spread angle θ of the vapor deposition particles follows the equations shown in Embodiments 1 to 3.

(Embodiment 5)

Figure 21:
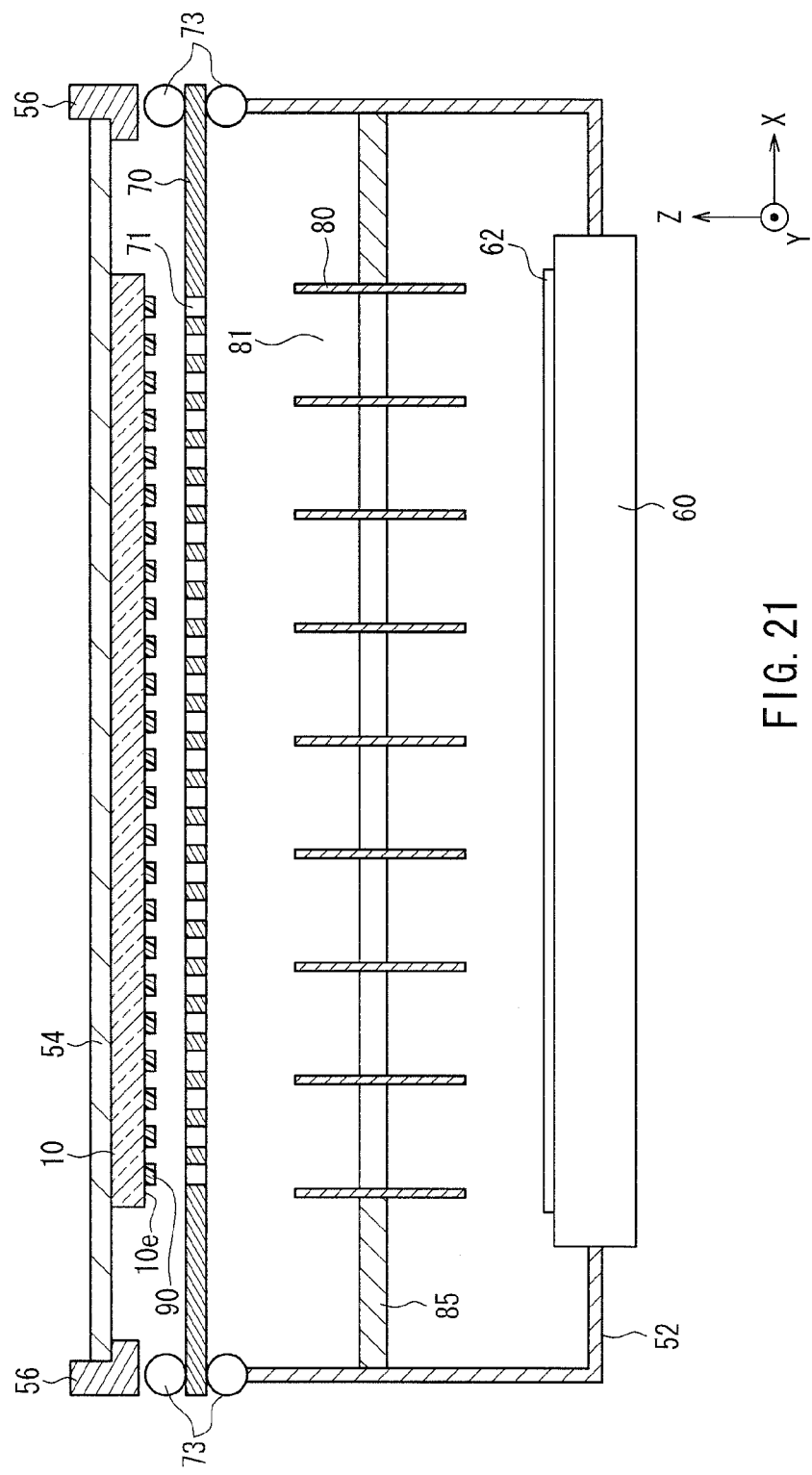
FIG. 21 is a front view of a vapor deposition device according to Embodiment 5 of the present invention as viewed in the scanning direction of a substrate.

FIG. 21 is a plan view of a vapor deposition device according to Embodiment 5 of the present invention as viewed in the scanning direction of a substrate. In Embodiments1 to 4, a plurality of vapor deposition source openings 61, each having a nozzle shape, are used as the vapor deposition source openings from which vapor deposition particles are discharged by the vapor deposition source 60, whereas in Embodiment 5, a slot-shaped vapor deposition source opening 62 is used. The vapor deposition source opening 62 is a long hole that is continuous in the X axis direction. A plurality of control plates 80 are disposed above the vapor deposition source opening 62. The opening diameter in the X axis direction of the vapor deposition source opening 62 is greater than the pitch P in the X axis direction of the control plates 80, and preferably twice or more greater than the pitch P. Furthermore, it is preferable that both ends in the X axis direction of the vapor deposition source opening 62 extend to the outside than the outermost control plates 80 in the X axis direction of the plurality of control plates 80.

In the present embodiment as well, as in Embodiments 1 to 4, at least a part of the coating film 90 formed on the substrate 10 is formed by the vapor deposition particles 91 that have passed through two or more different control spaces 81. Specifically, the vapor deposition particles 91 that have passed through a plurality of control spaces 81 located at different positions in the X axis direction adhere to the same place on the deposition surface 10e of the substrate 10. The maximum departure angle Φ (see FIG. 8) of the vapor deposition particles discharged from a slot-shaped vapor deposition source opening 62 is generally larger than the maximum departure angle Φ of the vapor deposition particles discharged from a nozzle-shaped vapor deposition source opening 61. Accordingly, in the case where the slot-shaped vapor deposition source opening 62 is used, the distance between the upper end of the control plates 80 and the position at which vapor deposition particle flows that have passed through neighboring control spaces 81 at least partially overlap with each other is generally shorter than that of the case where the nozzle-shaped vapor deposition source opening 61 is used.

The configuration of the vapor deposition device according to Embodiment 5 is the same as that of Embodiment 1 except for the above difference.

Example 5 corresponding to Embodiment 5 will be shown. It should be noted, however, that the present invention is not limited to the example given below.

Figure 22:
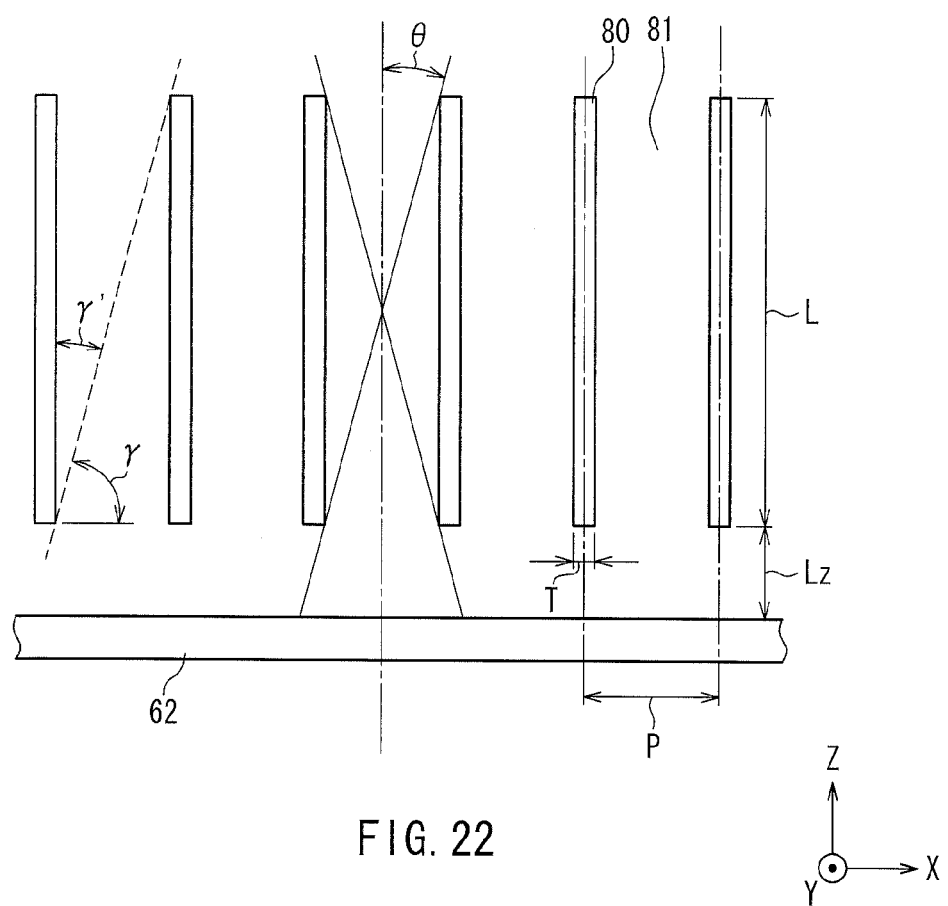
FIG. 22 is a partially enlarged front view showing an arrangement of a vapor deposition source opening and control plates in Example 5 corresponding to Embodiment 5 according to the present invention.

FIG. 22 is an enlarged view showing a part of the vapor deposition source opening 62 and the control plates 80.

The dimensions of each constituent element were set to be the same as those of Example 1, except that the length L in the Z axis direction of the control plates 80 was set to 75 mm, the interval Lz in the Z axis direction between the upper end of the vapor deposition source opening 62 and the lower end of the control plates 80 was set to 30 mm, and the distance from the upper end of the control plates 80 to the deposition surface 10e of the substrate 10 was set to 100 mm.

With respect to the angle γ defined by a pair of neighboring control plates 80 that were adjacent in the X axis direction, tan γ=10, and thus γ=84.3° was obtained. The spread angle γ' (γ'=90°−γ) of the vapor deposition particles determined by neighboring control plates 80 was therefore 5.7°. That is, the departure angle of the vapor deposition particles departing from the control space 81 was limited to 5.7° or less by the plurality of control plates 80.

In the present example, the length in the X axis direction of the vapor deposition source opening 62 is larger than the pitch P in the X axis direction of the control plates 80. Accordingly, the concept of the opening diameter Dn of the vapor deposition source openings 61,which was taken into account in Embodiments 1 to 3, does not exist in the present example. In the present example, the spread angle θ of the vapor deposition particles that have passed through the control space 81 is simply determined by the control plate 80 as follows:

$$\cot\theta = L/(P-T) \qquad (5\text{-}1).$$

From Equation (5-1), in the present example, the spread angle θ was 5.7°. Accordingly, the greatest incidence angle (maximum incidence angle) of the vapor deposition particles entering each mask opening 71 of the vapor deposition mask 70 was dependent on the spread angle θ, and found to be 5.7°.

The aspect ratio cot δ (see FIG. 8) of the mask openings 71 was approximately 1.7, which was the same as that of Example 1, and thus δ>θ was satisfied. Accordingly, the maximum incidence angle α of the vapor deposition particles with respect to the substrate 10 was dependent on the spread angle θ.

The pixel pattern and the vapor deposition rate were set to be the same as those of Example 1.

With the configuration as described above, as in Example 1, the substrate 10 was subjected to a single round trip scanning in the Y axis direction so as to form a vapor deposition film that was made of an organic material and had the desired pixel pattern, whereby a light emitting layer was formed. That is, among the vapor deposition particles discharged from the vapor deposition source opening 62, only those that have passed through the control spaces 81 and the mask openings 71 in this order adhered to the deposition surface 10e of the substrate 10.

In the present example, the maximum incidence angle α of the vapor deposition particles with respect to the substrate 10 was 5.7°, which was the same as the spread angle θ. Accordingly, the width We (see FIG. 7) of a blur portion of the coating film was as follows:

$$We = H \times \tan\alpha = 30\ \mu m.$$

The width We of the blur portion was smaller than the dimension in the X axis direction of a non-light-emitting region between neighboring light-emitting regions that were adjacent in the X axis direction. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

According to the present embodiment, because the vapor deposition source opening 62 has a slot shape, the total opening area can be increased as compared to that of a plurality of vapor deposition source openings 61, each having a nozzle shape. Accordingly, the vapor deposition rate can be improved.

In the case where the vapor deposition source openings 61 having a nozzle shape are used as in Embodiments 1 to 3, variations in the vapor deposition particle density are likely to occur in the X axis direction due to the opening diameter Dn of the vapor deposition source openings 61 or the relative positional relationship between the vapor deposition source openings 61 and the control plates. Furthermore, the variations in the vapor deposition particle density in the X axis direction are also likely to occur due to variations in the dimensional accuracy of the opening diameter Dn or the accuracy in the relative position between the vapor deposition source openings 61 and the control plates. In contrast, according to the present embodiment, the slot-shaped vapor deposition source opening 62 is used, variations in the vapor deposition particle density due to the above causes do not occur. Accordingly, the uniformity of the thickness of the coating film 90 is improved.

Embodiment 5 is the same as Embodiments 1 to 3 except for the above difference, and thus can produce the effects similar to those described in Embodiments 1 to 3.

Embodiment 5 described above is merely an example and can be changed as appropriate.

For example, in Example 5 given above, the vapor deposition source 60 is provided with only a single slot-shaped vapor deposition source opening 62, but the present invention is not limited thereto, and the vapor deposition source 60 may be provided with a plurality of slot-shaped vapor deposition source openings 62. The plurality of slot-shaped vapor deposition source openings 62 may be arranged so as to be linearly aligned in parallel to the X axis direction, or may be arranged at different positions in the Y axis direction such that plurality of slot-shaped vapor deposition source openings 62 at least partially overlap with each other in the Y axis direction.

As described in Embodiments 1 to 5 above, by disposing a plurality of control plates 80 side by side between the vapor deposition source 60 and the vapor deposition mask 70, it is possible to suppress blur in the coating film 90 formed on the substrate 10. As a result, by forming light emitting layers by using such a vapor deposition device, high-quality and highly reliably organic EL display devices can be achieved.

Also, at least a part of the coating film 90 is formed by the vapor deposition particles that have passed through two or more different control spaces 81. The uniformity of the thickness of the coating film 90 is thereby improved. As a result, by forming light emitting layers by using such a vapor deposition device, nonuniform light emission is suppressed, and high-quality organic EL display devices can be achieved.

In the present invention, the vapor deposition material that has been captured by and adhered to the surface of the control plates 80 can be removed from the control plates 80 and recovered by, for example, detaching the plurality of control plates 80 from the vapor deposition device together with the holding body 85 and heating the control plates so as to melt or sublimate the vapor deposition material. Accordingly, the vapor deposition material that has adhered to the control plates 80 is not wasted, the overall material utilization efficiency can be improved. In contrast, a shadow mask used in vapor deposition by color is generally made of an approximately 100 μm thick metal plate having a large number of fine openings formed therein, and is affixed to a frame under tension. Accordingly, when heated in the same manner as the control plates of the present invention are heated, the shadow mask may be deformed, making it difficult to use the shadow mask again. It was therefore difficult to recover the vapor deposition material that has adhered to the shadow mask. The control plates of the present invention have not undergone fine processing and receive no tension, and thus the above problems encountered with the shadow mask do not occur.

Also, in the present invention, in order to prevent the vapor deposition particles from entering the mask openings 71 at a large incidence angle, a part of the vapor deposition particles are captured by the control plates 80, prior to the vapor deposition mask 70. Accordingly, in the present invention, the amount of vapor deposition material adhering to the vapor deposition mask (the inner circumferential surface of the mask openings in particular) is reduced as compared to the new vapor deposition method shown in FIG. 5 that does not use the control plates 80. Accordingly, clogging of the mask openings is unlikely to occur, and thus the frequency of replacement of the vapor deposition mask due to adhesion of the vapor deposition material can be reduced.

In Embodiments 1 to 5 given above, regardless of the color (red, green, blue) of the organic light emitting layer material, vapor deposition by color is performed using the similarly designed control plates 80, but the present invention is not limited thereto, and for example, the design of the control plates 80 may be changed for each color. For example, in the case where no problem occurs in the characteristics even when a green light emitting layer material adheres to a neighboring pixel in a very small amount, the control plates 80 for use in vapor deposition using the green light emitting layer material may be configured such that the length L in the Z axis direction of the control plates 80 is shortened, so as to improve the vapor deposition rate and the material utilization efficiency.

In Embodiments 1 to 5 given above, the plurality of control plates 80 are disposed such that their major surface is parallel to the YZ plane, but the present invention is not limited thereto. For example, the plurality of control plates 80 may be disposed such that the major surface is parallel to the Y axis and inclined with respect to the deposition surface 10e of the substrate 10. The plurality of control plates 80 are preferably parallel to each other. In the case where the plurality of control plates 80 are disposed in an inclined manner, the equations described in Embodiments 1 to 5 can be applied by substituting effective dimensions or the like for the variables.

In the present invention, the control plates 80 may be cooled. A cooling device for cooling the control plates 80 may be attached to the control plates 80 or to the holding body 85 that holds the control plates 80 so as to cool the control plates 80 by heat conduction. There is no particular limitation on the cooling device, and for example, a water-cooling method can be used in which a coolant is passed through in a cooling pipe. Cooling the control plates 80 suppresses an increase in the temperature of the control plates 80, as a result of which the vapor deposition particles that have collided with the control plates 80 can be captured more reliably and re-vaporization of the vapor deposition particles from the control plates 80 can be prevented. It is also possible to prevent the occurrence of a phenomenon such as deformation or dimensional changes of the control plates 80 due to the control plates 80 being heated by radiant heat from the vapor deposition source 60.

Also, a temperature control device that adjusts the temperature of the control plates 80 to a predetermined temperature may be provided. There is no particular limitation on the configuration of the temperature control device, and for example, the temperature control device can be configured with a heating device that heats the control plates 80, a cooling device that cools the control plate 80, and a temperature detecting device that detects the temperature of the control plates 80. The heating device and the cooling device may be attached to the control plates 80 or to the holding body 85 that holds the control plates 80 so as to heat or cool the control plates 80 by heat conduction. There is no particular limitation on the heating device, and a known heater can be used, for example. There is no particular limitation on the cooling device, and for example, and a water-cooling method can be used in which a coolant is passed through in a cooling pipe. By appropriately controlling the temperature of the control plates 80, the vapor deposition particles captured by the control plates 80 can be caused to re-vaporize, whereby the material utilization efficiency can be further improved. The vapor deposition particles that have re-vaporized from the control plates 80 may fly in various directions depending on the temperature and the like of the control plates 80. If the re-vaporized vapor deposition particles enter the substrate 10 at an angle larger than the desired maximum incidence angle α, an unwanted blur portion is formed at the edge of the coating film. Accordingly, it is preferable to control the amount of vapor deposition particles that re-vaporize and the flight direction of the vapor deposition particles by adjusting the temperature of the control plates 80.

In Embodiments 1 to 4 given above, the opening shape of the vapor deposition source openings 61 having a nozzle shape as viewed in the Z axis direction is circular having a diameter Dn, but the present invention is not limited thereto, and the opening shape can be an ellipse, a rectangle, a square, any polygon and the like. In the case where the opening shape is noncircular, the diameter Dn described in Examples 1 to 4 may be replaced with the opening diameter in the X axis direction of the openings. Generally, when the opening shape or dimension of the vapor deposition source openings 61 having a nozzle shape is changed, the maximum departure angle Φ (FIG. 8) of the vapor deposition particles varies.

The shape of the control plates 80 as viewed in the X axis direction does not necessarily have to be rectangular, and may be substantially trapezoidal with the vapor deposition source 60 side being short and the vapor deposition mask 70 side being long, for example. Also, the control plates 80 do not necessarily have to be flat plates, and may be bent, curved or corrugated plates. Also, the thickness T of the control plates 80 does not necessarily have to be constant, and the control plates 80 may have, for example, a tapered cross section that is thick on the vapor deposition source 60 side and thin on the vapor deposition mask 70 side.

There is no particular limitation on the method for making the plurality of control plates 80. For example, as in Embodiments 1 to 5, it may be possible to separately make a plurality of control plates 80 and fix them to a holding body 85 by welding or the like. Alternatively, a plurality of linearly aligned through holes are formed in a thick board, and the wall between each neighboring through holes may be used as the control plate 80.

The pattern of the mask openings 71 formed on the vapor deposition mask 70 is not limited to that of Examples 1 to 5 given above. All of the mask openings 71 may have the same shape and dimensions, or may have different shapes and dimensions. The pitch in the X axis direction of the mask openings 71 may be constant or different.

In the vapor deposition devices shown in Embodiments 1 to 5 above, vapor deposition source openings 61, 62, a plurality of control plates 80 and a plurality of mask openings 71 are each aligned along a row extending in the X axis direction, but the present invention is not limited thereto. For example, a plurality of rows extending in the X axis direction may be arranged in the Y axis direction, the rows composed of at least one of the vapor deposition source openings, the control plates and the mask openings. In this case, the positions in the X axis direction of at least one of the vapor deposition source openings, the control plates and the mask openings may be the same or different between the plurality of rows.

In Embodiments 1 to 5 described above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 5 described above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

INDUSTRIAL APPLICABILITY

There is no particular limitation on the fields to which the vapor deposition device and vapor deposition method of the present invention is applied, and the present invention is preferably used to form light emitting layers for use in organic EL display devices.

DESCRIPTION OF SYMBOLS

10 Substrate
  10e Deposition Surface
20 Organic EL Element
  23R, 23G 23B Light Emitting Layer
50 Vapor Deposition Unit
56 Moving Mechanism
60 Vapor Deposition Source
61, 62 Vapor Deposition Source Opening
70 Vapor Deposition Mask
71 Mask Opening
80 Control Plate
81 Inter-Control Plate Space (Control Space)
90 Coating Film
10 91 Vapor Deposition Particle
92 Vapor Deposition Particle Flow

The invention claimed is:

1. A vapor deposition method for forming a coating film having a predetermined pattern on a substrate, the method comprising:
   a vapor deposition step of forming the coating film by causing vapor deposition particles to adhere to the substrate,
   wherein the vapor deposition step uses a vapor deposition unit including:
     a vapor deposition source having a plurality of vapor deposition source openings,
   wherein each of the plurality of vapor deposition source openings is configured to discharge the vapor deposition particles,
     a vapor deposition mask disposed between the plurality of vapor deposition source openings and the substrate, and
     a plurality of control plates disposed between the plurality of vapor deposition source openings and the vapor deposition mask in a first direction that is orthogonal to a normal line direction of the substrate, in a state in which the substrate and the vapor deposition mask are spaced apart at a fixed interval, the vapor deposition particles that have passed through neighboring inter-control plate spaces in the first direction and a plurality of mask openings formed in the vapor deposition mask are configured to adhere to the substrate while one of the substrate and the vapor deposition unit is moved relative to the other in a second direction that is orthogonal to the normal line direction of the substrate and the first direction, wherein the plurality of control plates are thin plates that have same dimensions and are disposed at a fixed pitch in the first direction while major surfaces are perpendicular to the first direction, the major surfaces being surfaces having the largest area of the plurality of control plates, wherein the plurality of vapor deposition source openings are arranged in the first direction and at the same pitch as a pitch of the plurality of control plates, and the plurality of vapor deposition source openings each have a nozzle shape, wherein in the first direction, each of the plurality of vapor deposition source openings is arranged at a center of neighboring control plates, and wherein when vapor deposition particle flows which are flows of the vapor deposition particles that are discharged from the plurality of vapor deposition source openings and pass through the inter-control plate spaces are viewed in the second direction, a deposition surface of the substrate is disposed at a position where a degree of overlap is 2 or more and is also constant in the first direction, the degree of overlap being a number of overlapping vapor deposition particle flows.

2. The vapor deposition method according to claim 1, wherein the plurality of vapor deposition source openings are arranged at a pitch that is an integer multiple of a pitch of the plurality of control plates.

3. The vapor deposition method according to claim 1, wherein the plurality of vapor deposition source openings are arranged at a pitch that is a unit fraction of a pitch of the plurality of control plates.

4. The vapor deposition method according to claim 1, wherein the vapor deposition particles discharged from the vapor deposition source opening pass through only a single inter-control plate space located right in front of the vapor deposition source opening.

5. The vapor deposition method according to claim 1, wherein the vapor deposition particles discharged from the vapor deposition source opening pass through only a single inter-control plate space located right in front of the vapor deposition source opening and inter-control plate spaces located on both sides of the inter-control plate space.

6. The vapor deposition method according to claim 1, wherein in the vapor deposition step, either one of the plurality of vapor deposition source openings and the plurality of control plates is moved relative to the other.

7. The vapor deposition method according to claim 6, wherein a direction of the relative movement is the first direction.

8. The vapor deposition method according to claim 6, wherein the relative movement is a reciprocal movement.

9. The vapor deposition method according to claim 1, wherein in the vapor deposition step, both the plurality of vapor deposition source openings and the plurality of control plates are moved relative to the vapor deposition mask.

10. The vapor deposition method according to claim 1, wherein the coating film is a light emitting layer for an organic EL element.

11. A method for manufacturing an organic EL display device, the method comprising a step of forming a light emitting layer by using a vapor deposition method according to claim 1.

* * * * *